(12) United States Patent
Kwak et al.

(10) Patent No.: US 11,923,375 B2
(45) Date of Patent: Mar. 5, 2024

(54) DISPLAY APPARATUS AND METHOD OF MANUFACTURING THE SAME

(71) Applicant: Samsung Display Co., LTD., Yongin-si (KR)

(72) Inventors: Wonkyu Kwak, Yongin-si (KR); Jaeyong Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/156,128

(22) Filed: Jan. 18, 2023

(65) Prior Publication Data

US 2023/0215870 A1 Jul. 6, 2023

Related U.S. Application Data

(63) Continuation of application No. 17/101,493, filed on Nov. 23, 2020, now Pat. No. 11,563,034, which is a continuation of application No. 16/660,376, filed on Oct. 22, 2019, now Pat. No. 10,847,546, which is a continuation of application No. 16/277,914, filed on
(Continued)

(30) Foreign Application Priority Data

Feb. 6, 2015 (KR) .......................... 10-2015-0018904

(51) Int. Cl.
| | | |
|---|---|---|
| *H01L 27/12* | (2006.01) | |
| *H10K 50/842* | (2023.01) | |
| *H10K 71/00* | (2023.01) | |
| *H10K 50/844* | (2023.01) | |

(Continued)

(52) U.S. Cl.
CPC ...... *H01L 27/1218* (2013.01); *H01L 27/1248* (2013.01); *H01L 27/1262* (2013.01); *H01L 27/1266* (2013.01); *H10K 50/8426* (2023.02); *H10K 71/00* (2023.02); *H10K 50/844* (2023.02); *H10K 59/122* (2023.02); *H10K 59/124* (2023.02); *H10K 71/851* (2023.02)

(58) Field of Classification Search
CPC ............ H01L 27/1218; H01L 27/1248; H01L 27/1262; H01L 27/1266; H01L 51/5246; H01L 51/56; H01L 27/3246; H01L 27/3258; H01L 51/5253; H01L 2251/566; H01L 27/124; H01L 27/1259
See application file for complete search history.

(56) References Cited

U.S. PATENT DOCUMENTS 6,774,414 B2 8/2004 Chang
8,111,220 B2 2/2012 Asano et al.
(Continued)

FOREIGN PATENT DOCUMENTS

CN 1628263 A 6/2005
CN 101853875 A 10/2010
(Continued)

*Primary Examiner* — Kyoung Lee
(74) *Attorney, Agent, or Firm* — LEWIS ROCA ROTHGERBER CHRISTIE LLP

(57) ABSTRACT

A display apparatus includes a substrate partitioned into a central area and a peripheral area disposed adjacent to the central area. The central area includes a display area; a first insulating layer corresponding to the peripheral area of the substrate; at least one slit corresponding to a region of the first insulating layer; and a cladding layer, which covers the at least one slit, on the first insulating layer.

20 Claims, 37 Drawing Sheets

Related U.S. Application Data

Feb. 15, 2019, now Pat. No. 10,461,096, which is a continuation of application No. 15/817,628, filed on Nov. 20, 2017, now Pat. No. 10,211,228, which is a continuation of application No. 14/800,521, filed on Jul. 15, 2015, now Pat. No. 9,825,056.

(51) Int. Cl.
*H10K 59/122* (2023.01)
*H10K 59/124* (2023.01)

(56) References Cited

U.S. PATENT DOCUMENTS

| | | | |
|---|---|---|---|
| 8,409,925 B2 | 4/2013 | Lee et al. | |
| 9,190,630 B2 | 11/2015 | Kim et al. | |
| 9,287,335 B2 | 3/2016 | Yi | |
| 9,448,757 B2 | 9/2016 | Kim et al. | |
| 9,472,507 B2 | 10/2016 | Kwak | |
| 9,608,215 B2 | 3/2017 | Minami et al. | |
| 9,758,872 B2 | 9/2017 | Lee | |
| 9,825,056 B2 | 11/2017 | Kwak et al. | |
| 9,876,064 B2 | 1/2018 | Kim et al. | |
| 10,461,096 B2 | 10/2019 | Kwak et al. | |
| 2005/0110730 A1 | 5/2005 | Kim et al. | |
| 2010/0213482 A1 | 8/2010 | Kim et al. | |
| 2012/0287026 A1 | 11/2012 | Masuda | |
| 2013/0099221 A1 | 4/2013 | Kawamura | |
| 2014/0014979 A1* | 1/2014 | Matsumoto | H01L 27/1248 438/22 |
| 2014/0097429 A1 | 4/2014 | Kim et al. | |
| 2014/0098005 A1 | 4/2014 | Kim et al. | |
| 2014/0138641 A1 | 5/2014 | Yi | |
| 2014/0291630 A1 | 10/2014 | Namkung | |
| 2015/0036299 A1 | 2/2015 | Namkung et al. | |

FOREIGN PATENT DOCUMENTS

| | | |
|---|---|---|
| CN | 102568377 A | 7/2012 |
| CN | 102820264 A | 12/2012 |
| CN | 103811530 A | 5/2014 |
| CN | 105261620 A | 1/2016 |
| CN | 103811530 B | 1/2017 |
| CN | 104425550 B | 12/2018 |
| KR | 10-2003-0094599 A | 12/2003 |
| KR | 10-2005-0019969 A | 3/2005 |
| KR | 10-2005-0051300 A | 6/2005 |
| KR | 10-2010-0010810 A | 2/2010 |
| KR | 10-2010-0020167 A | 2/2010 |
| KR | 10-2010-0096545 A | 9/2010 |
| KR | 10-2014-0045838 A | 4/2014 |
| KR | 10-2014-0065988 A | 5/2014 |
| KR | 10-2014-0119583 A | 10/2014 |
| KR | 10-2014-0146510 A | 12/2014 |
| WO | 2012/017498 A1 | 2/2012 |

* cited by examiner

DISPLAY APPARATUS AND METHOD OF MANUFACTURING THE SAME

CROSS-REFERENCE TO RELATED APPLICATIONS

Any and all applications for which a foreign or domestic priority claim is identified in the Application Data Sheet as filed with the present application are hereby incorporated by reference under 37 CFR 1.57.

This application is a continuation of U.S. patent application Ser. No. 17/101,493, filed Nov. 23, 2020, which is a continuation of U.S. patent application Ser. No. 16/660,376, filed Oct. 22, 2019, now U.S. Pat. No. 10,847,546, which is a continuation of U.S. patent application Ser. No. 16/277,914, filed Feb. 15, 2019, now U.S. Pat. No. 10,461,096, which is a continuation of U.S. patent application Ser. No. 15/817,628, filed Nov. 20, 2017, now U.S. Pat. No. 10,211,228, which is a continuation of U.S. patent application Ser. No. 14/800,521, filed Jul. 15, 2015, now U.S. Pat. No. 9,825,056, which claims priority to and the benefit of Korean Patent Application No. 10-2015-0018904, filed Feb. 6, 2015, the entire content of all of which is incorporated herein by reference.

BACKGROUND

Field

One or more embodiments relate to a display apparatus and a method of manufacturing the same.

Description of the Related Technology

Recently, display apparatuses have been used for various purposes. As the display apparatuses are thin and light weight, their usage range has become wide.

In particular, recently, flat panel display apparatuses are further studied and are manufactured.

The display apparatus, in more detail, the flat panel display apparatus, has a plurality of various films. When an external force is applied to the flat panel display apparatus, or due to a process condition during the manufacture of the flat panel display apparatus, the various films may be damaged or may create a path of crack propagation.

When display apparatuses are formed from one mother substrate, the manufacture may include a process of cutting the mother substrate so as to separate the display apparatuses.

During the cutting process, a crack may occur on the films of the display apparatus, and the films may create a path of crack propagation.

Accordingly, durability of the display apparatus is affected.

SUMMARY OF CERTAIN INVENTIVE ASPECTS

One or more embodiments include a display apparatus and a method of manufacturing the same.

Additional aspects will be set forth in part in the description which follows and, in part, will be apparent from the description, or may be learned by practice of the presented embodiments.

According to one or more embodiments, a display apparatus includes a substrate partitioned into a central area and a peripheral area disposed adjacent to the central area, the central area including a display area; a first insulating layer corresponding to the peripheral area of the substrate; at least one slit corresponding to a region of the first insulating layer; and a cladding layer on the first insulating layer and covering the at least one slit.

The display apparatus may further include one or more insulating layers in the display area, and the cladding layer may include a same material as a material of the one or more insulating layers.

A depth of the at least one slit may be less than or equal to a thickness of the first insulating layer.

The cladding layer may extend in one direction and may be parallel to an edge of the substrate.

A width of the cladding layer may be greater than a width of the at least one slit.

A length of the cladding layer may be longer than a length of the at least one slit.

The first insulating layer may extend to the display area.

The first insulating layer may extend to an edge of the substrate.

The display apparatus may further include a barrier layer between the substrate and the first insulating layer.

The barrier layer may extend to the display area.

The display apparatus may further include a second insulating layer on the first insulating layer, and the at least one slit may extend through the second insulating layer.

The second insulating layer may extend to the display area.

The at least one slit may be spaced apart from at least one edge of the substrate.

The at least one slit may overlap with at least one edge of the substrate.

The cladding layer may be spaced apart from at least one edge of the substrate.

The cladding layer may overlap with at least one edge from among edges of the substrate.

A plurality of slits may be spaced apart from each other in one direction.

The plurality of slits may be disposed in a direction that crosses the one direction.

Among the plurality of slits, a width of a slit most adjacent to an edge of the substrate may be greater than a width of each of slits other than the slit most adjacent to the edge of the substrate.

Among the plurality of slits, a width of a slit furthest from an edge of the substrate may be greater than a width of each of slits other than the slit furthest from the edge of the substrate.

Among the plurality of slits, a width of a middle slit located between a slit furthest from an edge of the substrate and a slit most adjacent to the edge of the substrate may be greater than a width of each of slits other than the middle slit.

At least one edge from among edges of the substrate may be defined as a cutting line.

The substrate may include a flexible material.

The substrate may include an organic material.

The substrate may include multiple layers.

The substrate may further include a first layer including an organic material, a second layer including an organic material, and an insertion layer between the first layer and the second layer.

The display apparatus may further include a particle that remains in the at least one slit, and the cladding layer may be formed to cover the particle.

The display apparatus may further include at least one encapsulating layer in the display area.

The at least one encapsulating layer may extend to the peripheral area.

The at least one encapsulating layer may be spaced apart from the cladding layer.

The at least one encapsulating layer may include one or more inorganic encapsulating layers or one or more organic encapsulating layers.

The display apparatus may further include a plurality of thin-film transistors (TFTs) in the central area of the substrate, each of the plurality of TFTs including an active layer, a gate electrode, a source electrode, and a drain electrode, wherein one or more insulating layers may be adjacent to at least one of the active layer, the gate electrode, the source electrode, and the drain electrode, and the cladding layer and the one or more insulating layers may include a same material.

The first insulating layer may extend to the central area and may be disposed between the substrate and the plurality of TFTs.

The display apparatus may further include a passivation layer on the source electrode and the drain electrode, and the cladding layer and the passivation layer may be formed of a same material.

The display apparatus may further include a second insulating layer between the gate electrode and the active layer, and the second insulating layer may be on the first insulating layer and may extend to the peripheral area so as to correspond to the at least one slit.

The display apparatus may further include an interlayer insulating layer between the gate electrode and the source and drain electrodes, and the interlayer insulating layer may be on the first insulating layer and may extend to the peripheral area so as to correspond to the at least one slit.

The display apparatus may further include a first electrode electrically connected to at least one of the plurality of TFTs, and a pixel defining layer covering a portion of the first electrode and defining a pixel area The display apparatus may further include a second electrode facing the first electrode; and an intermediate layer between the first electrode and the second electrode and including an organic emission layer.

The cladding layer and the pixel defining layer may include a same material.

The cladding layer may surround the display area.

The cladding layer may correspond to edges of the display area, except for one of the edges.

The cladding layer may include one or more main portions corresponding to edges of the substrate, and may include a corner portion connecting two adjacent main portions.

The display apparatus may further include a pad area in the peripheral area of the substrate, wherein the cladding layer is near the pad area and includes curved portions that correspond to the pad area and are curved toward the display area or are curved away from the display area.

According to one or more embodiments, a method of manufacturing a display apparatus including a substrate partitioned into a central area and a peripheral area adjacent to the central area, the central area including a display area, the method including forming a first insulating layer to correspond to the peripheral area of the substrate; forming at least one slit by partially removing a vertical portion of the first insulating layer, wherein the at least one slit corresponds to a region of the first insulating layer that; and forming a cladding layer on the first insulating layer, wherein the cladding layer covers the at least one slit.

The method may further include forming one or more insulating layers in the display area, and the cladding layer may include a same material as the one or more insulating layers formed in the display area.

The method may further include forming a plurality of thin-film transistors (TFTs) in the central area of the substrate, wherein each of the plurality of TFTs includes an active layer, a gate electrode, a source electrode, and a drain electrode.

The method may further include forming a passivation layer on the source electrode and the drain electrode, where forming the passivation layer may include forming a via hole in the passivation layer so as to expose a region of at least one of the source electrode and the drain electrode, and the cladding layer may include a same material as the passivation layer, and may be simultaneously patterned with the forming of the via hole.

According to one or more embodiments, a method of manufacturing a display apparatus including a central area and a peripheral area adjacent to the central area, by using a mother substrate, the method including cutting the mother substrate along cutting lines, forming a first insulating layer to correspond to the peripheral area; forming at least one slit by partially removing a vertical portion of the first insulating layer, wherein the slit corresponds to a region of the first insulating layer; forming a cladding layer on the first insulating layer, wherein the cladding layer covers the at least one slit; and performing a cutting process along the cutting lines, and thus, separating one or more display apparatuses formed on the mother substrate.

During the cutting process, the cutting lines may be spaced apart from the cladding layer.

During the cutting process, the cutting lines may overlap with the cladding layer.

BRIEF DESCRIPTION OF THE DRAWINGS

These and/or other aspects will become apparent and more readily appreciated from the following description of certain embodiments, taken in conjunction with the accompanying drawings in which.

DETAILED DESCRIPTION OF CERTAIN INVENTIVE EMBODIMENTS

Figure 1:
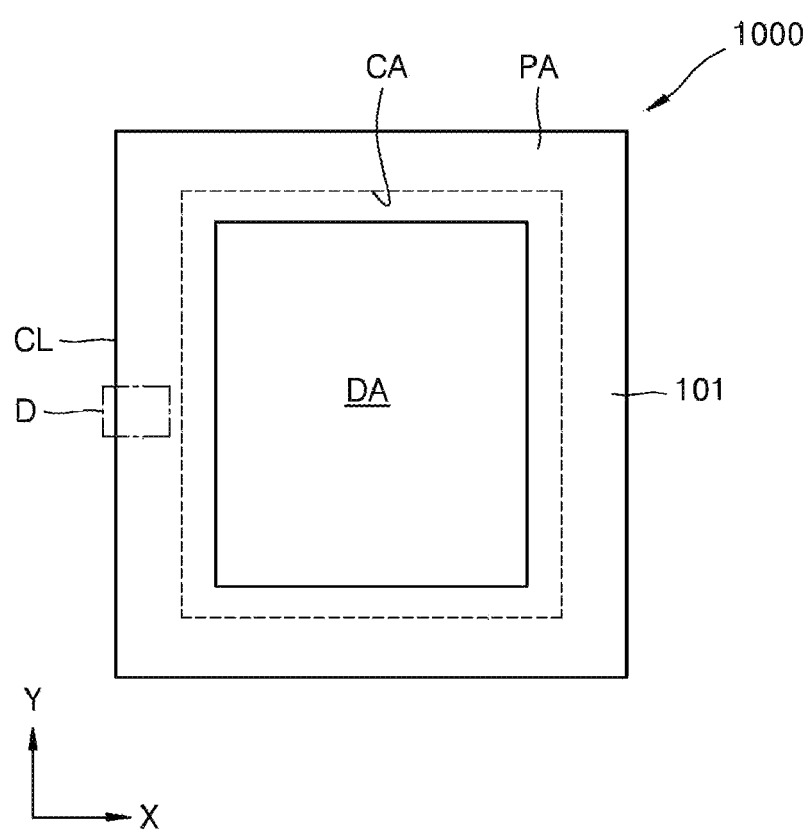
FIG. 1 illustrates a plan view of a display apparatus according to an embodiment.

As the inventive concepts allow for various changes and numerous embodiments, particular embodiments will be illustrated in the drawings and described in detail in the written description. Effects and features of the inventive concepts and methods of accomplishing the same may be understood more readily by reference to the following detailed description of embodiments and the accompanying drawings. The inventive concepts may, however, be embodied in many different forms and should not be construed as being limited to the embodiments set forth herein.

In one or more embodiments, such terms as "first," "second," or the like, may be used, but such components must not be limited to the above terms, and the above terms are used only to distinguish one component from another.

In one or more embodiments, a singular form may include plural forms, unless there is a particular description contrary thereto.

In one or more embodiments, terms such as "include" or "comprising" are used to specify existence of a recited feature or component, not excluding the existence of one or more other recited features or one or more other components.

In one or more embodiments, it will also be understood that when an element such as layer, region, area, or component is referred to as being "on" another element, it can be directly on the other element, or intervening elements such as layer, region, area, or component may also be interposed therebetween.

In the drawings, for convenience of description, the sizes of layers and regions may be exaggerated for clarity. For example, a size and thickness of each element may be random for convenience of description, thus, one or more embodiments are not limited thereto.

In one or more embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

In one or more embodiments, an order of processes may be different from that is described. For example, two processes that are sequentially described may be substantially simultaneously performed, or may be performed in an opposite order to the described order.

One or more embodiments will be described below in more detail with reference to the accompanying drawings. Those components that are the same or are in correspondence are generally rendered the same reference numeral regardless of the figure number, and redundant explanations are omitted.

As used herein, the term "and/or" includes any and all combinations of one or more of the associated listed items. Expressions such as "at least one of," when preceding a list of elements, modify the entire list of elements and do not modify the individual elements of the list.

Figure 2:
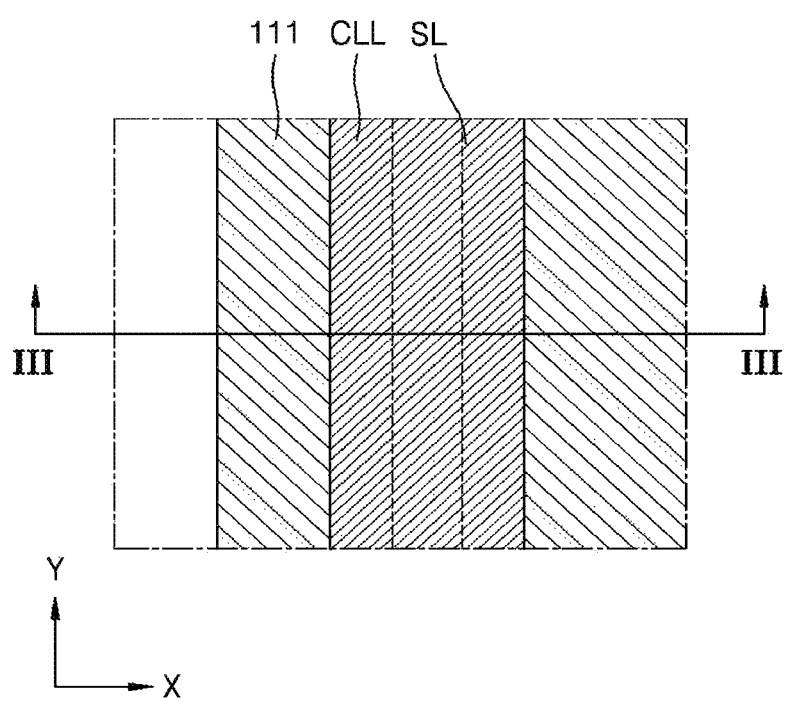
FIG. 2 illustrates a magnified view of a portion D of FIG. 1.

FIG. 1 illustrates a plan view of a display apparatus 1000 according to an embodiment. FIG. 2 illustrates a magnified view of a portion D of FIG. 1, and FIG. 3 illustrates a cross-sectional view of the portion D, taken along a line III-Ill of FIG. 2.

Figure 3:
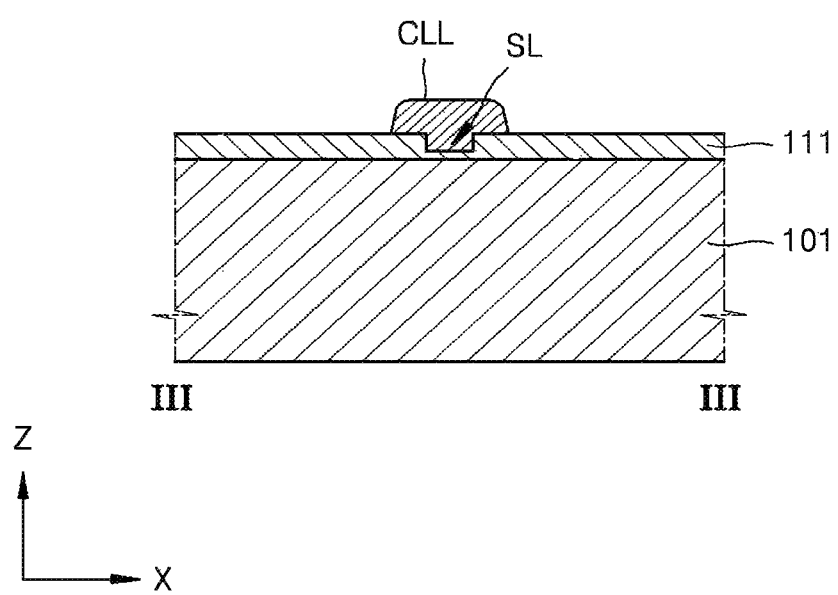
FIG. 3 illustrates a cross-sectional view of the portion D, taken along a line III-III of FIG. 2.

Referring to FIGS. 1 through 3, the display apparatus 1000 includes a substrate 101. The substrate 101 may include various materials. In some embodiments, the substrate 101 may include a glass material, a metal material, or other organic material.

In some embodiments, the substrate 101 may include a flexible material. For example, the substrate 101 may be well bent, curved, folded, or rolled.

In some embodiments, the substrate 101 may include ultra-thin glass, metal, or plastic. For example, when plastic is used, the substrate 101 may include polyimide (PI), but embodiments are not limited thereto, and thus various materials may be used.

A plurality of the display apparatuses 1000 may be formed on a mother substrate, and may be separated into each display apparatus 1000 in a manner that the mother substrate is cut along cutting lines CL of the substrates 101. FIG. 1 illustrates one display apparatus 1000 that is cut along the cutting line CL and thus is separated. Thus, an edge of the substrate 101 is defined by the cutting line CL.

All edges of the substrate 101, such as for example the four edges of the substrate 101 shown in FIG. 1 may all be cutting lines CL. In an embodiment, one, two, or three of the four edges of the substrate 101 may be cutting lines CL.

According to a size or shape of the mother substrate, a position or the number of edges from among all edges of the display apparatus 1000 that are determined as a cutting line CL may vary.

The substrate 101 is partitioned into a peripheral area PA and a central area CA. The peripheral area PA includes an area around the cutting line CL. The area adjacent to the cutting line CL, and the central area CA indicates an area that is inwardly positioned, compared to the peripheral area PA.

Embodiments are not limited thereto. The cutting line CL may not exist. One display apparatus 1000 may be formed on a mother substrate, and in this case, the substrate 101 may correspond to the mother substrate, so that the cutting line CL may not exist. In this case, the peripheral area PA may indicate an area adjacent to an edge of the substrate 101, and the central area CA may indicate an area that is inwardly positioned, compared to the peripheral area PA. For convenience of description, it is assumed that the cutting line CL exists in embodiments described below.

The central area CA may include at least one display area DA.

The display area DA may include at least one display device (not shown), such as, for example, an organic light-emitting device (OLED) for displaying an image. Also, a plurality of pixels (not shown) may be disposed in the display area DA, and at least one display device (not shown) may be disposed in each of the pixels.

A non-display area (not shown) may be formed around the display area DA. The non-display area may be formed to surround the display area DA. In some embodiments, the non-display area may be formed to be adjacent to a plurality of sides of the display area DA. In some embodiments, the non-display area may be formed to be adjacent to one side of the display area DA.

In some embodiments, only the display area DA may be arranged in the central area CA. The non-display area may be formed only in the peripheral area PA.

A pad area (not shown) may be formed in the non-display area. A driver or a plurality of pad units (not shown) may be disposed in the pad area.

In some embodiments, at least one insulating layer (not shown) may be formed in the display area DA of the central area CA. The insulating layer may include an organic material or an inorganic material.

The peripheral area PA indicates the area adjacent to the cutting line CL and is arranged in edges of the substrate 101 along the cutting line CL.

A first insulating layer 111 is formed on the substrate 101 in the peripheral area PA. A slit SL is formed on the first insulating layer 111. The slit SL is formed in the peripheral area PA so as to be spaced apart from the display area DA.

The first insulating layer 111 may include various insulating materials. In some embodiments, the first insulating layer 111 may include an inorganic material. For example, the first insulating layer 111 may include oxide, nitride, or oxynitride. The first insulating layer 111 may include, for example, silicon nitride ($SiN_x$), silicon oxide ($SiO_2$), or silicon oxynitride ($SiO_xN_y$).

In some embodiments, the first insulating layer 111 may be formed while extending to the central area CA or the display area DA. In some embodiments, the first insulating layer 111 may be commonly formed on the central area CA and the peripheral area PA of the substrate 101. The first insulating layer 111 may be formed on an entire top surface of the substrate 101.

The first insulating layer 111 may decrease or prevent moisture or impurities from penetrating into the display apparatus 1000 via the substrate 101, and may provide a planar surface on a top surface of the substrate 101.

In some embodiments, the first insulating layer 111 may extend to the cutting line CL of the substrate 101.

Embodiments are not limited thereto, and the first insulating layer 111 may not cover the top surface of the substrate 101 in a region of the peripheral area PA.

The slit SL is formed from the first insulating layer 111 by removing a vertical portion of the first insulating layer 111. However, a method of forming the slit SL is not limited to the etching method.

The slit SL may be formed by not completely removing but partially removing the vertical portion of the first insulating layer 111, so that a region of the substrate 101 may not be exposed. A thickness of the slit SL may be less than the thickness of the first insulating layer 111.

The slit SL may have various shapes, including, for example, a shape extending in one direction.

In some embodiments, as illustrated in FIG. 2, the slit SL may be formed in such a manner that the slit SL may have a side surface parallel to the edge of the substrate 101 or the cutting line CL.

Here, a length of the slit SL may vary and thus may be less than or greater than a length of the display area DA.

In some embodiments, the slit SL may be spaced apart from the central area CA, and for example, the slit SL may be spaced apart from the display area DA.

A cladding layer CLL is formed on the first insulating layer 111 so as to cover the slit SL.

In some embodiments, a width of the cladding layer CLL may be greater than a width of the slit SL, and a length of the cladding layer CLL may be greater than a length of the slit SL. By doing so, the cladding layer CLL may completely cover the slit SL so as to prevent the slit SL from being exposed.

The cladding layer CLL may include various materials. The cladding layer CLL may include an inorganic or organic material.

In some embodiments, the cladding layer CLL may include the organic material. By doing so, an appropriate thickness and an appropriate width of the cladding layer CLL may be ensured, and as a result, the cladding layer CLL may cover the slit SL.

In some embodiment, the cladding layer CLL may include a same material as an insulating layer (not shown) that may be formed in the central area CA of the substrate 101. Also, the cladding layer CLL and an insulating layer (not shown) that may be formed in the display area DA of the substrate 101 may be simultaneously formed.

The cladding layer CLL may be formed in the peripheral area PA.

In some embodiments, the cladding layer CLL may be disposed between the edge of the substrate 101 and a boundary of the central area CA.

In some embodiments, the cladding layer CLL may be disposed between the cutting line CL and a boundary of the central area CA.

The cladding layer CLL may extend lengthwise. As illustrated in FIG. 2, the cladding layer CLL may have a shape that extends lengthwise in parallel to the cutting line CL of the substrate 101. The length of the cladding layer CLL may vary, and thus may be greater or lesser than a length of the display area DA.

The slit SL in the first insulating layer 111 that is arranged in the peripheral area PA of the display apparatus 1000 blocks crack propagation from the edge of the substrate 101. For example, the slit SL that is adjacent to the cutting line CL of the substrate 101 primarily prevents propagation of a crack that may occur on the substrate 101 when each display apparatus 1000 is cut and then is separated from the mother substrate.

In particular, the first insulating layer 111 may be formed in the peripheral area PA of the substrate 101 and may selectively extend to the cutting line CL, thereby protecting a top surface of the substrate 101. Also, the slit SL may block or decrease a crack, or propagation of the crack, that may occur on the first insulating layer 111 due to a pressure that is applied to the first insulating layer 111.

The cladding layer CLL is formed on the slit SL. Due to the cladding layer CLL, movement of foreign substances or particles that may be generated on the slit SL may be prevented. In some embodiments, the cladding layer CLL may cover the slit SL and thus, may not expose the foreign substances or the particles in the slit SL.

When the display apparatus 1000 is manufactured, the foreign substances or the particles may be generated in the slit SL. For example, a conductive material that is used to form an electrode (not shown) in a manufacturing procedure of the display apparatus 1000 may remain in the slit SL. The conductive material remaining in the slit SL may cause a defect of the display apparatus 1000 in a subsequent process, such as, for example, the remaining conductive material may move to the display area DA and may cause an electrical defect of the display area DA, which results in deterioration in an electrical characteristic and an image quality.

However, the cladding layer CLL is formed on the slit SL and thus may prevent the movement of the remaining foreign substances and particles, so that a defect that may occur in the display area DA may be decreased and prevented.

Also, due to the first insulating layer 111, it is possible to prevent the cladding layer CLL from being delaminated from the substrate 101.

FIGS. 4 through 13 illustrate modified examples of the slit SL and the cladding layer CLL of FIGS. 1 through 3. For convenience of description, the modified examples will be described only in consideration of features different from those of the previous embodiment.

Figure 4:
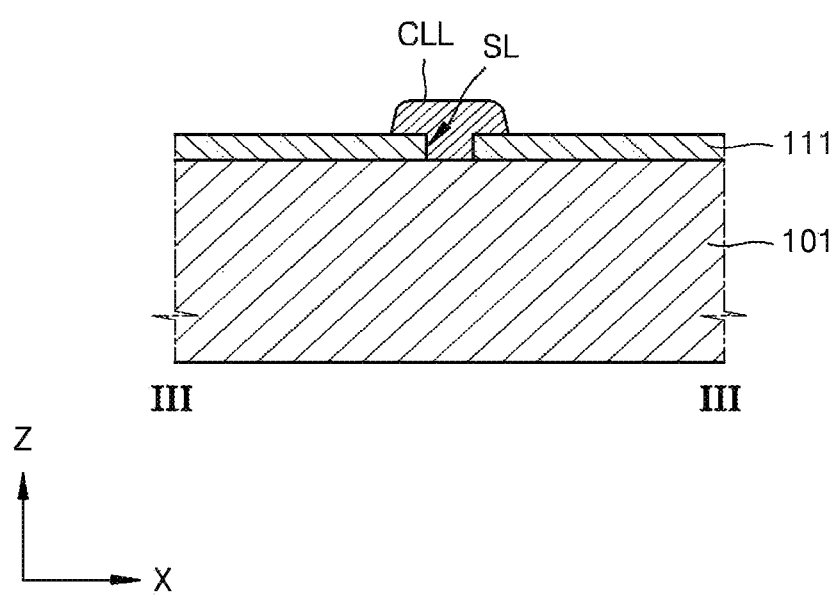
FIGS. 4 through 12 illustrate modified examples of a slit and a cladding layer of FIGS. 1 through 3.

Referring to FIG. 4, the first insulating layer 111 is formed on the substrate 101, and a slit SL is formed by partially removing the first insulating layer 111. A depth of the slit SL corresponds to a thickness of the first insulating layer 111.

Some embodiments may have a structure in which a slit SL has a depth that corresponds to a thickness of the first insulating layer 111 as shown in FIG. 4.

Figure 5:
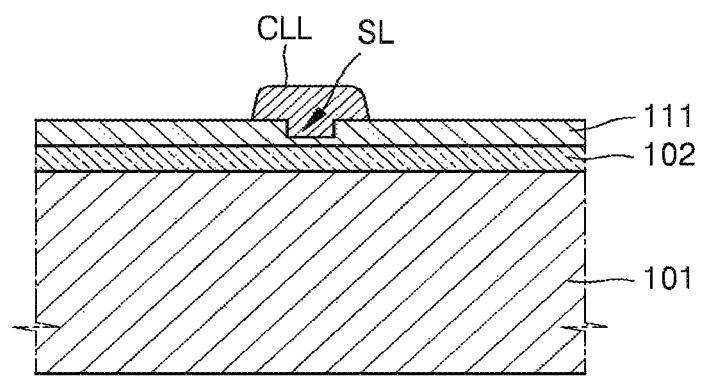
Figure 5:
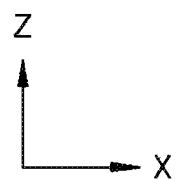

Referring to FIG. 5, a barrier layer 102 is disposed between the substrate 101 and the first insulating layer 111. The slit SL is formed in the first insulating layer 111.

The slit SL is not formed in the barrier layer 102 and is formed only in the first insulating layer 111. The barrier layer 102 may decrease or prevent moisture or foreign substances from penetrating into the display apparatus 1000 via the substrate 101. Since the slit SL is not formed in the barrier layer 102, the barrier layer 102 may decrease or prevent the moisture or the foreign substances from penetrating toward the slit SL.

In some embodiments, the slit SL may have a depth greater than that shown in FIG. 5, and thus may be formed even in the barrier layer 102.

The barrier layer 102 may include, for example, silicon nitride ($SiN_x$), silicon oxide ($SiO_2$), or silicon oxynitride ($SiO_xN_y$).

Figure 6:
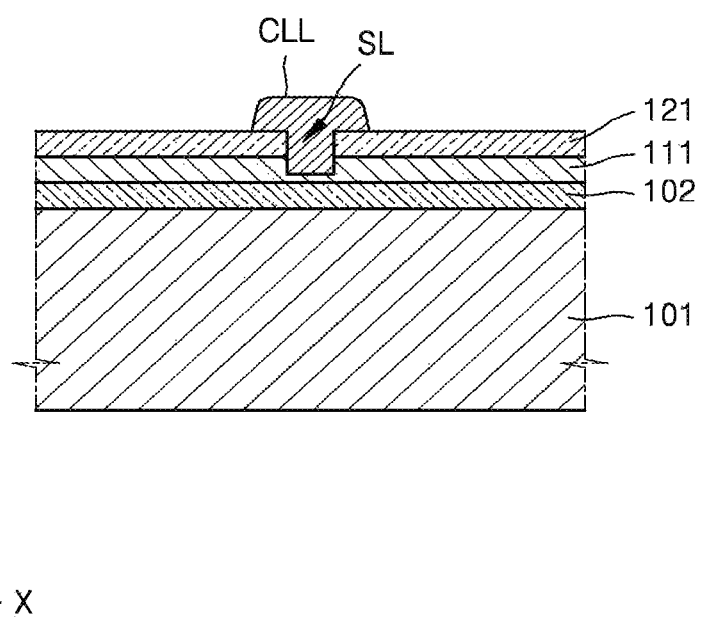

Referring to FIG. 6, a second insulating layer 121 is formed on the first insulating layer 111. The second insulating layer 121 may include various insulating materials. In some embodiments, the second insulating layer 121 may include a same material as the first insulating layer 111.

In some embodiments, the second insulating layer 121 may include an inorganic material.

For example, the second insulating layer 121 may include oxide, nitride, or oxynitride. The second insulating layer 121 may include, for example, silicon nitride ($SiN_x$), silicon oxide ($SiO_2$), or silicon oxynitride ($SiO_xN_y$).

In some embodiments, the second insulating layer 121 may extend to the central area CA and may be formed in the display area DA. In some embodiments, the second insulating layer 121 may be completely formed in the central area CA and the peripheral area PA of the substrate 101.

In some embodiments, the second insulating layer 121 may extend to the cutting line CL of the substrate 101.

Embodiments are not limited thereto, and in a region of the peripheral area PA, the second insulating layer 121 may not cover a top surface of the substrate 101.

The slit SL is formed in the second insulating layer 121. The slit SL is formed in the second insulating layer 121 and the first insulating layer 111. The slit SL may extend through the second insulating layer 121. By doing so, the slit SL may have a thickness that is equal to or greater than a predetermined value, so that, when the cladding layer CLL is formed in the slit SL, the cladding layer CLL is deeply filled in the slit SL and thus is stably disposed in the slit SL. By doing so, it is possible to decrease or to prevent the cladding layer CLL from being delaminated from the slit SL.

Although not illustrated, at least one insulating layer (not shown) may be additionally formed on the second insulating layer 121, and the slit SL may extend through the at least one insulating layer.

Also, the barrier layer 102 may be formed between the substrate 101 and the first insulating layer 111. In some embodiments, the barrier layer 102 of FIG. 6 may be skipped.

Figure 7:
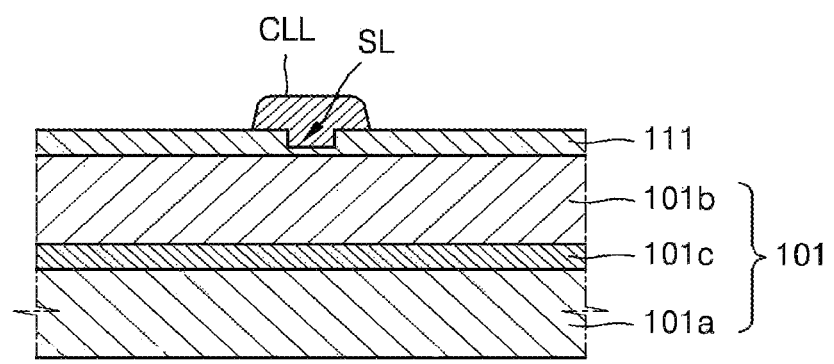
Figure 7:
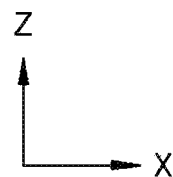

Referring to FIG. 7, the substrate 101 is not a single layer but is multiple layers including a first layer 101a, a second layer 101b, and an insertion layer 101c. The first layer 101a and the second layer 101b may include an organic material, and the insertion layer 101c may include an inorganic material. In some embodiments, the first layer 101a and the second layer 101b may include a plastic material such as, for example, polyimide, and the insertion layer 101c may include, for example, silicon oxide.

Embodiments are not limited thereto, and the first layer 101a and the second layer 101b may include various types of same or different organic materials. The insertion layer 101c may include various materials capable of functioning as a barrier, and may not have a single-layered structure but may have a multi-layered structure.

Although not illustrated, the multi-layered structure of the substrate 101 shown in FIG. 7 may be applied to the previous embodiments, modified examples thereof, and one or more embodiments described below.

Figure 8:
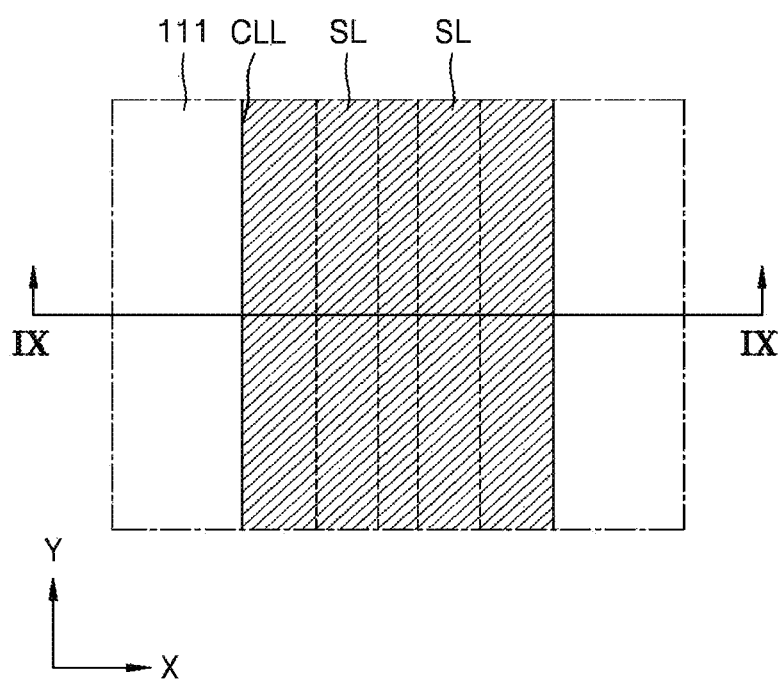

Referring to FIG. 8, a plurality of slits SL are formed in the first insulating layer 111. Although FIG. 8 illustrates two slits SL, embodiments are not limited thereto. More slits SL, such as for example, three or more, may be formed in other embodiments.

In some embodiments, the plurality of slits SL may be spaced apart from each other. The plurality of slits SL may be arrayed in one direction, such as for example in a width direction (see X-axis direction of FIG. 8) of the plurality of slits SL.

Figure 9:
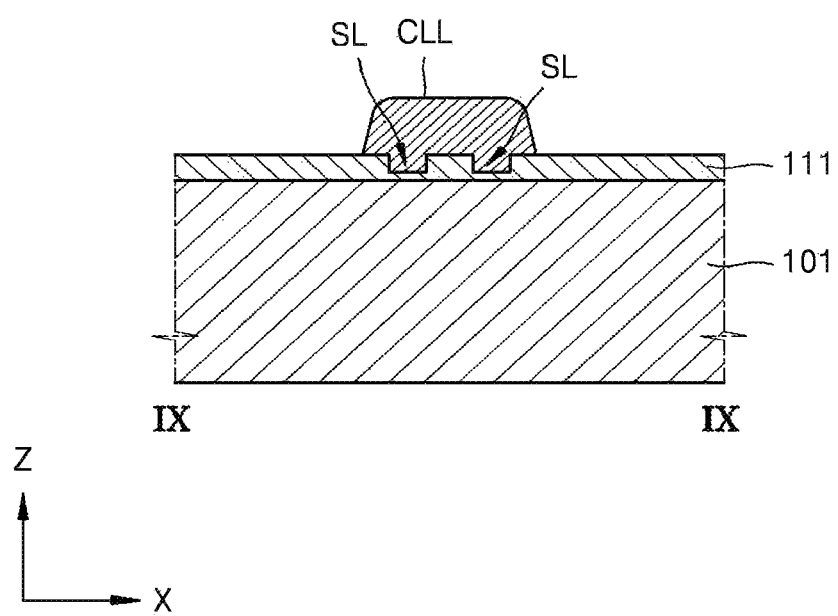

As seen in FIG. 9, the cladding layer CLL may cover all of the plurality of slits SL. Although not illustrated, in some embodiments, the cladding layer CLL may be formed as a plurality of cladding layers CLL that are spaced apart from each other so as to correspond to the plurality of slits SL, respectively.

In some embodiments, the plurality of slits SL may be formed in parallel to each other and may have a regular width. Although not illustrated, widths of the plurality of slits SL may be different from each other. A structure of the plurality of slits SL shown in FIG. 9 may be applied to the previous embodiments and one or more embodiments described below.

The plurality of slits SL and spaces formed therebetween may efficiently block crack propagation to the substrate 101 via a cutting line CL of the substrate 101. Crack occurrence may be minimized due to a slit SL that is most adjacent to the cutting line CL, or an edge of the substrate 101, from among the plurality of slits SL and an effect of blocking additional crack occurrence and propagation may be improved due to another slit SL that is second most adjacent to the cutting line CL.

Figure 10:
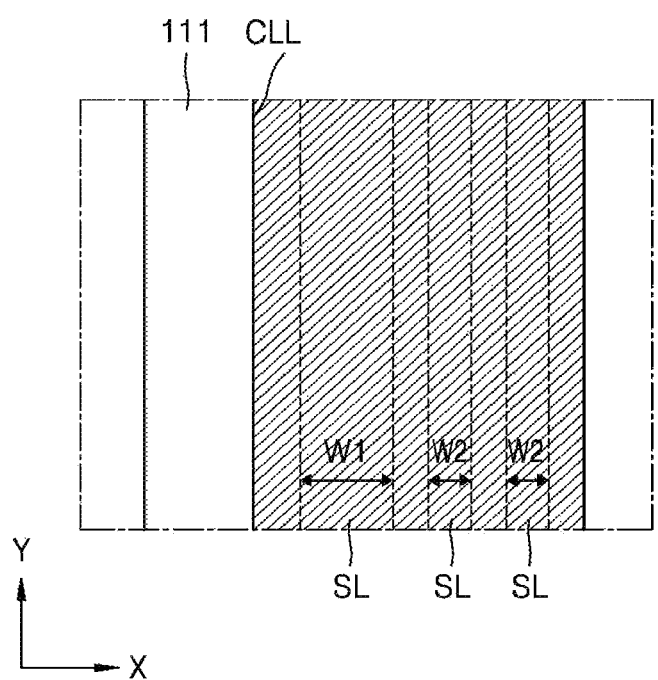

Referring to FIG. 10, a plurality of slits SL are formed. Among the slits SL, a width W1 of a slit SL that is most adjacent to an edge of the substrate 101 or the cutting line CL may be different from widths W2 of other slits SL. Among the slits SL, the width W1 of the slit SL that is most adjacent to the edge of the substrate 101 or the cutting line CL is greater than each of the widths W2 of other slits SL. By doing so, an effect of primarily preventing propagation of a crack that has occurred at the cutting line CL of the substrate 101 may be increased.

Figure 11:
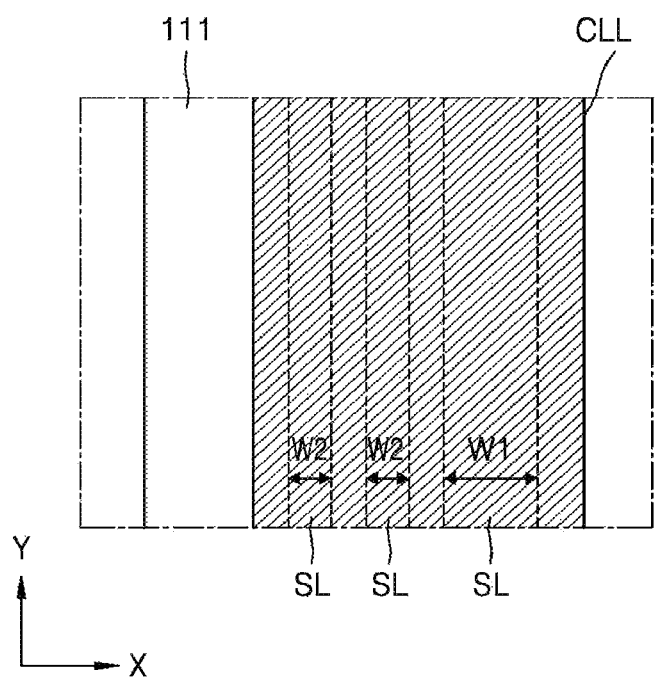
Figure 12:
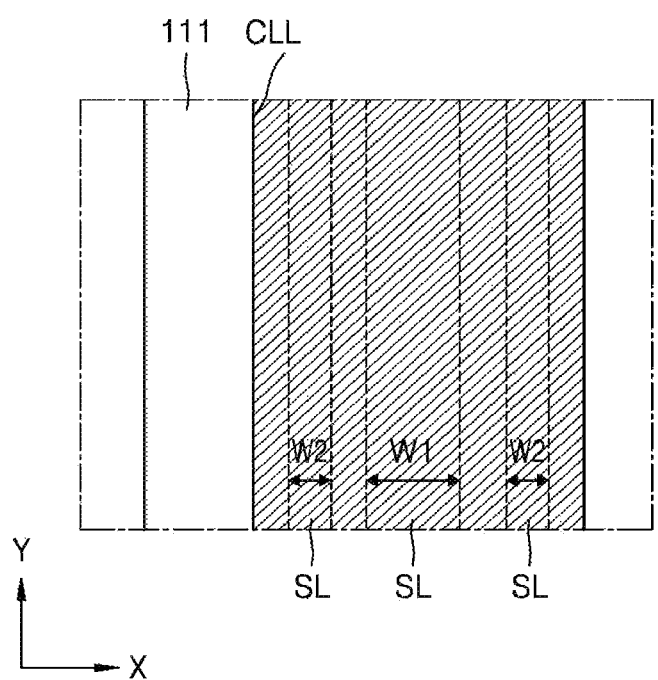

Embodiments are not limited thereto, and widths of the plurality of slits SL may be variously set. For example, as illustrated in FIG. 11, among the slits SL, a width W1 of a slit SL that is furthest from the edge of the substrate 101 or the cutting line CL may be greater than each of widths W2 of other slits SL. Also, among the plurality of slits SL, a width S1 of a slit SL located between a slit SL most adjacent to the edge of the substrate 101 or the cutting line CL and a slit SL furthest from the edge of the substrate 101 or the cutting line CL may be greater than widths W2 of the slits SL, as illustrated in FIG. 12.

Figure 13:
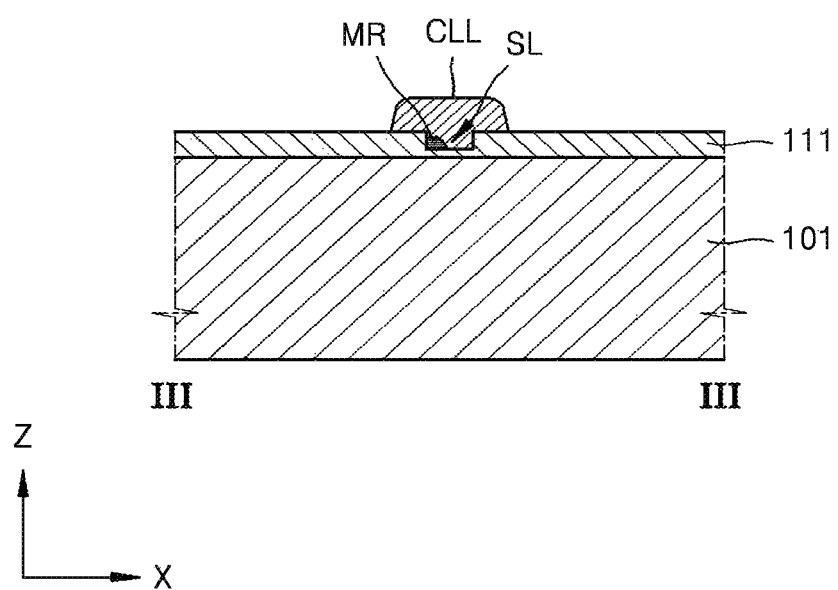
FIG. 13 illustrates an example in which a particle remains in a slit of the display apparatus, according to an embodiment.

FIG. 13 illustrates an example in which a particle MR remains in a slit SL of the display apparatus 1000, according to an embodiment.

Referring to FIG. 13, the particle MR remains in the slit SL of the display apparatus 1000 described with reference to FIGS. 1 through 3. The particle MR may be, for example, a metal particle, a metal layer waste, or other metal residue. The particle MR may be generated from an outer source, or be a residue of materials for forming elements of the display apparatus 1000 during the manufacturing procedure of the display apparatus 1000.

When a cladding layer CLL formed on the slit SL, the cladding layer CLL covers the particle MR, thus, movement of the particle MR may be prevented or a possibility of the movement of the particle MR may be decreased. The cladding layer CLL may prevent the particle MR from moving to the display area DA of the display apparatus 1000. By doing so, a defect of the display area DA of the display apparatus 1000 may be prevented, so that the display apparatus 1000 may have an improved electrical characteristic and/or an improved image quality.

Figure 14:
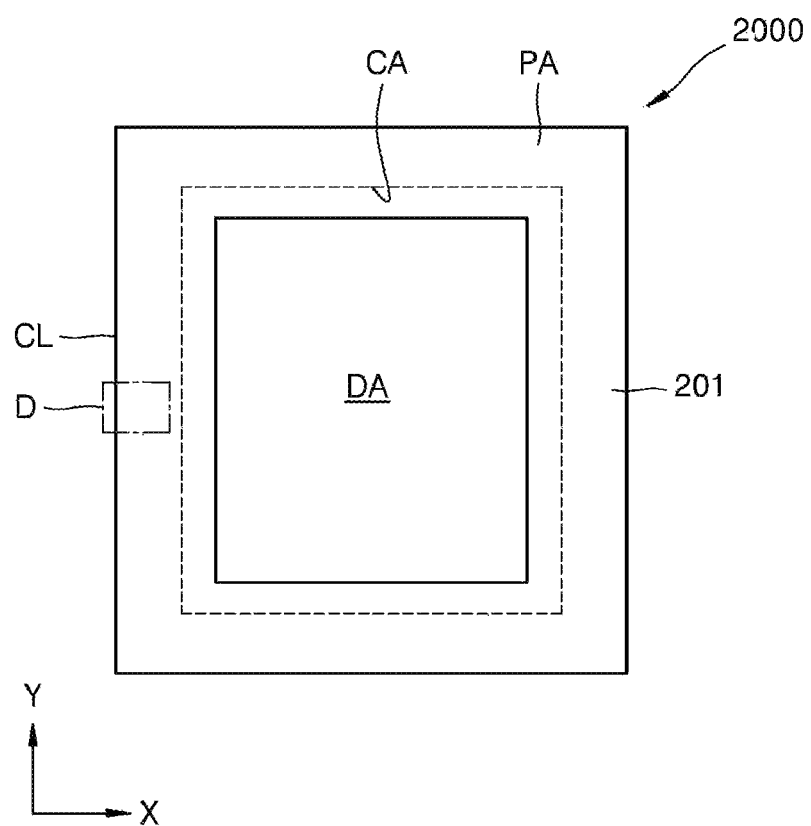
FIG. 14 illustrates a plan view of a display apparatus, according to another embodiment.
Figure 15:
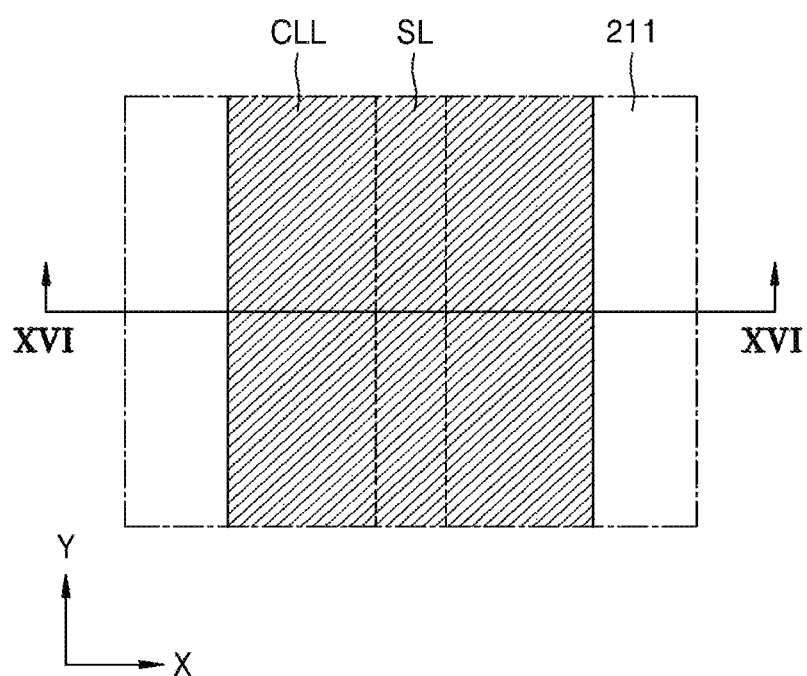
FIG. 15 illustrates a magnified view of a portion D of FIG. 14.

FIG. 14 illustrates a plan view of a display apparatus 2000, according to another embodiment. FIG. 15 illustrates a magnified view of a portion D of FIG. 14, and FIG. 16 illustrates a cross-sectional view of the portion D, taken along a line XVI-XVI of FIG. 15.

Figure 16:
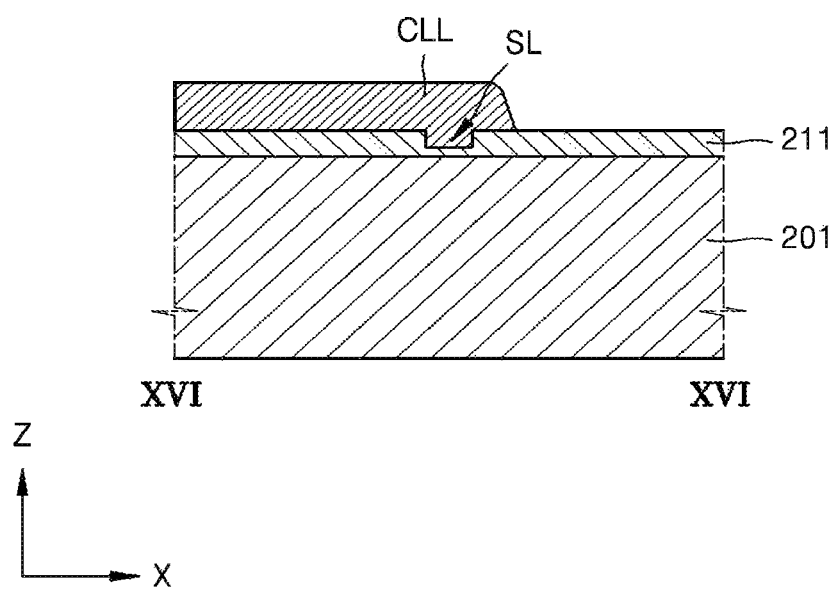
FIG. 16 illustrates a cross-sectional view of the portion D, taken along a line XVI-XVI of FIG. 15.

Referring to FIGS. 14 through 16, the display apparatus 2000 includes a substrate 201. The substrate 201 may include various materials. Detailed examples of the various materials of the substrate 201 are the same as those described in the previous embodiments, and thus detailed descriptions thereof are omitted here.

A plurality of the display apparatuses 2000 may be formed on a mother substrate, and may be separated into each display apparatus 2000 in a manner that the mother substrate is cut along cutting lines CL of the substrates 201. FIG. 14 illustrates one display apparatus 2000 that is cut along the cutting line CL and thus is separated. Thus, an edge of the substrate 201 is defined by the cutting line CL.

All edges of the substrate 201, such as the four edges of the substrate 201 shown in FIG. 14 may all be cutting lines CL. In other embodiments, one, two, or three of the four edges of the substrate 201 may be cutting lines CL.

According to a size or shape of the mother substrate, a position or the number of edges from among all edges of the display apparatus 2000 that are determined as a cutting line CL may vary.

The substrate 201 is partitioned into a peripheral area PA and a central area CA. The peripheral area PA includes an area around the cutting line CL, i.e., the area adjacent to the cutting line CL, and the central area CA indicates an area that is inwardly positioned, compared to the peripheral area PA.

Embodiments are not limited thereto. The cutting line CL may not exist. One display apparatus 2000 may be formed on a mother substrate, and in this case, the substrate 201 may correspond to the mother substrate, so that the cutting line CL may not exist. In this case, the peripheral area PA may indicate an area adjacent to an edge of the substrate 201, and the central area CA may indicate an area that is inwardly positioned, compared to the peripheral area PA. For convenience of description, it is assumed that the cutting line CL exists in embodiments described below.

The central area CA may include at least one display area DA.

The display area DA may have at least one display device (not shown), such as, for example, an OLED for displaying an image. Also, a plurality of pixels may be arranged in the display area DA.

A non-display area (not shown) may be formed around the display area DA. The non-display area may be formed to surround the display area DA. In some embodiments, the non-display area may be formed to be adjacent to a plurality of sides of the display area DA. In some embodiments, the non-display area may be formed to be adjacent to one side of the display area DA.

In another embodiment, only the display area DA may be arranged in the central area CA. The non-display area may be formed only in the peripheral area PA.

A pad area (not shown) may be formed in the non-display area. A driver or a plurality of pad units (not shown) may be disposed in the pad area.

In some embodiments, at least one insulating layer (not shown) may be formed in the display area DA of the central area CA. The insulating layer may include an organic material or an inorganic material.

The peripheral area PA indicates the area adjacent to the cutting line CL and is arranged in edges of the substrate 201 along the cutting line CL.

A first insulating layer 211 is formed on the substrate 201 in the peripheral area PA. A slit SL is formed in the first insulating layer 211. The slit SL is formed in the peripheral area PA so as to be spaced apart from the display area DA.

The first insulating layer 211 may include various insulating materials. In some embodiments, the first insulating layer 211 may include an inorganic material. For example, the first insulating layer 211 may include oxide, nitride, or oxynitride. The first insulating layer 211 may include, for example, silicon nitride ($SiN_x$), silicon oxide ($SiO_2$), or silicon oxynitride ($SiO_xN_y$).

In some embodiments, the first insulating layer 211 may be formed while extending to the central area CA or the display area DA. In some embodiments, the first insulating layer 211 may be commonly formed on the central area CA and the peripheral area PA of the substrate 201. The first insulating layer 211 may be formed on an entire top surface of the substrate 201.

In some embodiments, the first insulating layer 211 may extend to the cutting line CL of the substrate 201.

Embodiments are not limited thereto, and the first insulating layer 211 may not cover the top surface of the substrate 201 in a region of the peripheral area PA.

A cladding layer CLL is formed on the first insulating layer 211 so as to cover the slit SL.

In some embodiments, a width of the cladding layer CLL may be greater than a width of the slit SL, and a length of the cladding layer CLL may be greater than a length of the slit SL. By doing so, the cladding layer CLL may completely cover the slit SL so as to prevent the slit SL from being exposed.

The cladding layer CLL may include various materials. The cladding layer CLL may include an inorganic or organic material.

In some embodiments, the cladding layer CLL may include the organic material. By doing so, an appropriate thickness and an appropriate width of the cladding layer CLL may be ensured, and as a result, the cladding layer CLL may cover the slit SL.

In some embodiment, the cladding layer CLL may include a same material as an insulating layer (not shown) that may be formed in the central area CA of the substrate 201. Also, the cladding layer CLL and an insulating layer (not shown) that may be formed in the display area DA of the substrate 201 may be simultaneously formed.

In some embodiment, the cladding layer CLL may be formed to be adjacent to the edge of the substrate 201 or the cutting line CL.

A side surface of the cladding layer CLL that is adjacent to the edge of the substrate 201 or the cutting line CL, and another side surface of the cladding layer CLL that faces the side surface may have different shapes. For example, the side surface of the cladding layer CLL that is adjacent to the edge of the substrate 201 or the cutting line CL may be a planar surface that is almost perpendicular to the ground, and the other side surface of the cladding layer CLL that faces the side surface may be a sloped surface or a curved surface.

When the mother substrate is cut along the cutting line CL, the display apparatus 2000 may be obtained by performing a cutting process on the cladding layer CLL disposed at the cutting line CL, and as a result, the side surface of the cladding layer CLL may have a cross-section resulting from the cutting process.

Figure 17:
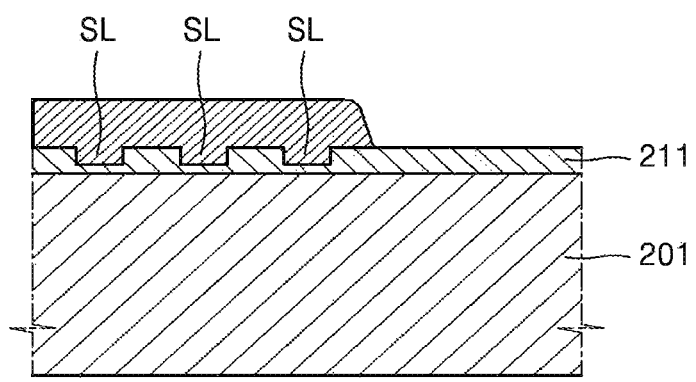
FIG. 17 illustrates a modified example of the slit and the cladding layer shown in FIGS. 15 and 16.

FIG. 17 illustrates a modified example of the slit SL and the cladding layer CLL shown in FIGS. 15 and 16.

Referring to FIG. 17, a plurality of slits SL are formed. Although not illustrated, one of the plurality of slits SL may overlap with a cutting line CL.

Figure 18:
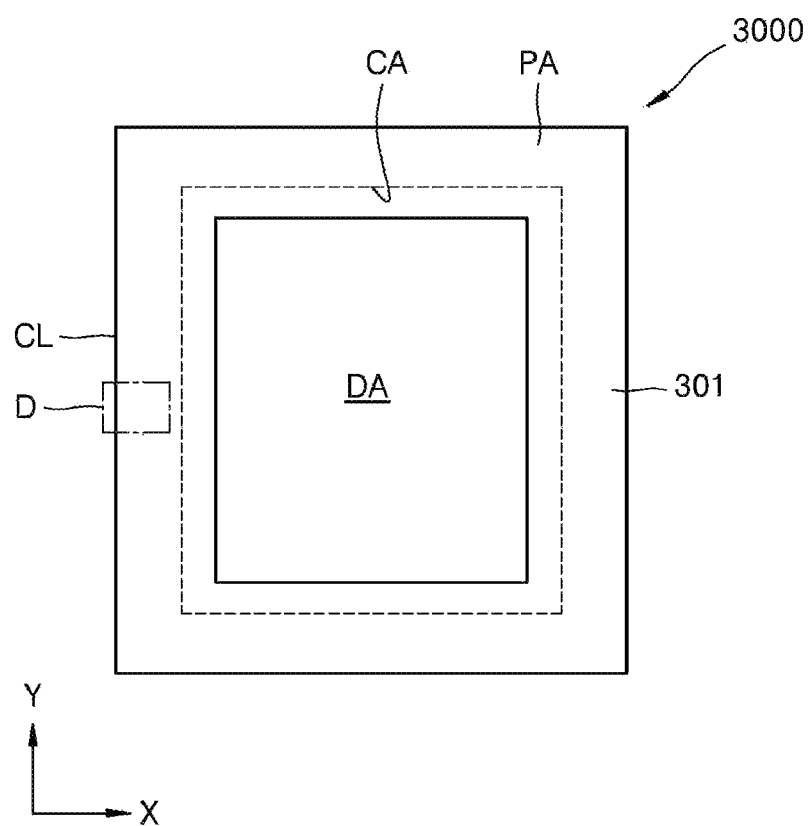
FIG. 18 illustrates a plan view of a display apparatus, according to another embodiment.
Figure 19:
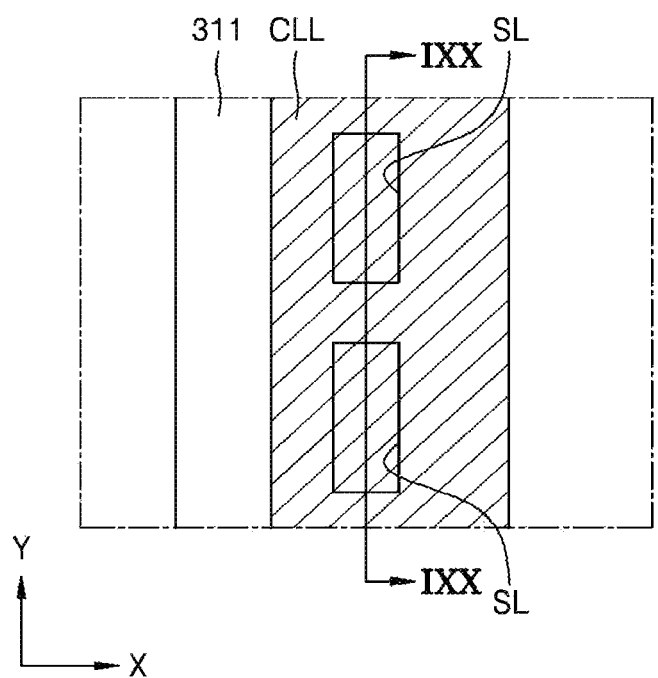
FIG. 19 illustrates a magnified view of a portion D of FIG. 18.

FIG. 18 illustrates a plan view of a display apparatus 3000, according to another embodiment. FIG. 19 illustrates a magnified view of a portion D of FIG. 18, and FIG. 20 illustrates a cross-sectional view of the portion D, taken along a line IXX-IXX of FIG. 20.

Figure 20:
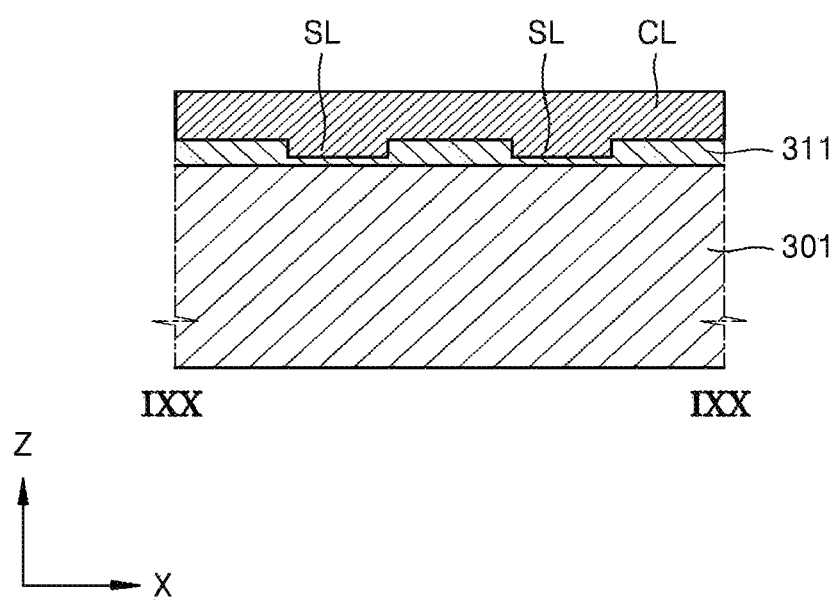
FIG. 20 illustrates a cross-sectional view of the portion D, taken along a line IXX-IXX of FIG. 20.

Referring to FIGS. 18 through 20, the display apparatus 3000 includes a substrate 301. The substrate 301 may include various materials. Detailed examples of the various materials of the substrate 301 are the same as those described in the previous embodiments, and thus detailed descriptions thereof are omitted here.

A plurality of the display apparatuses 3000 may be formed on a mother substrate, and may be separated into each display apparatus 3000 in a manner that the mother substrate is cut along cutting lines CL of the substrates 301. FIG. 18 illustrates one display apparatus 3000 that is cut along the cutting line CL and thus is separated. Thus, an edge of the substrate 301 is defined by the cutting line CL.

All edges of the substrate 301, such as for example the four edges of the substrate 301 shown in FIG. 18 may all be cutting lines CL. In some embodiments, one, two, or three of the four edges of the substrate 301 may be cutting lines CL.

According to a size or shape of the mother substrate, a position or the number of edges from among all edges of the display apparatus 3000 that are determined as a cutting line CL may vary.

The substrate 301 is partitioned into a peripheral area PA and a central area CA. The peripheral area PA indicates an area around the cutting line CL, and the central area CA indicates an area that is inwardly positioned, compared to the peripheral area PA.

Embodiments are not limited thereto. The cutting line CL may not exist. One display apparatus 3000 may be formed on a mother substrate, and in this case, the substrate 301 may correspond to the mother substrate, so that the cutting line CL may not exist. In this case, the peripheral area PA may indicate an area adjacent to an edge of the substrate 301, and the central area CA may indicate an area that is inwardly positioned, compared to the peripheral area PA. For convenience of description, it is assumed that the cutting line CL exists in embodiments described below.

The central area CA may include at least one display area DA.

The display area DA may include at least one display device (not shown), such as, for example, an OLED for displaying an image. Also, a plurality of pixels may be disposed in the display area DA.

A non-display area (not shown) may be formed around the display area DA. The non-display area may be formed to surround the display area DA. In some embodiments, the non-display area may be formed to be adjacent to a plurality of sides of the display area DA. In some embodiments, the non-display area may be formed to be adjacent to one side of the display area DA.

In some embodiments, only the display area DA may be arranged in the central area CA. The non-display area may be formed only in the peripheral area PA.

A pad area (not shown) may be formed in the non-display area. A driver or a plurality of pad units (not shown) may be disposed in the pad area.

In some embodiments, at least one insulating layer (not shown) may be formed in the display area DA of the central area CA. The insulating layer may include an organic material or an inorganic material.

A first insulating layer 311 is formed in the substrate 301 in the peripheral area PA. A plurality of slits SL is formed in the first insulating layer 311. The plurality of slits SL may be spaced apart from each other.

The plurality of slits SL may be arrayed in a direction that crosses another direction being from the edge of the substrate 301 or the cutting line CL to the display area DA.

Figure 21:
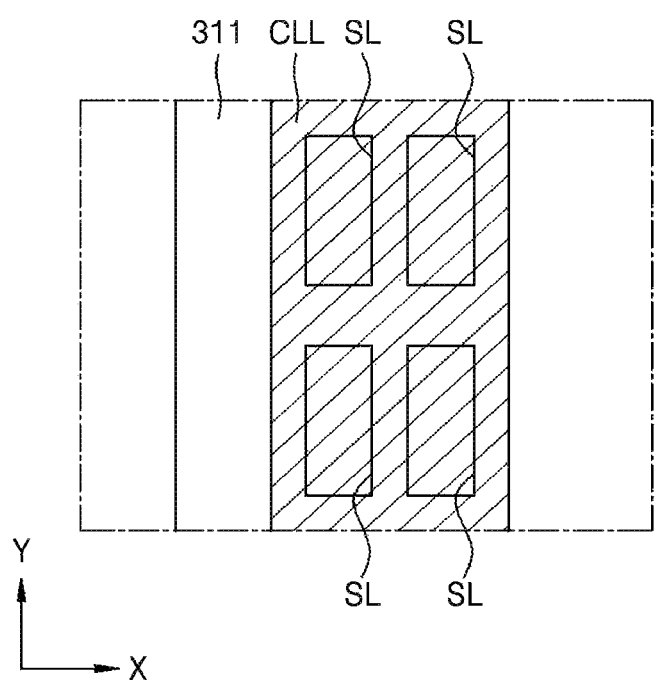
FIG. 21 illustrates a modified example of the slit and the cladding layer shown in FIGS. 18 through 20.

Also, as illustrated in FIG. 21, a plurality of slits SL may be formed in a direction (see Y-axis direction of FIG. 21) and another direction (see X-axis direction of FIG. 21) that crosses the direction.

A cladding layer CLL may be formed to cover all of the plurality of slits SL.

Figure 22:
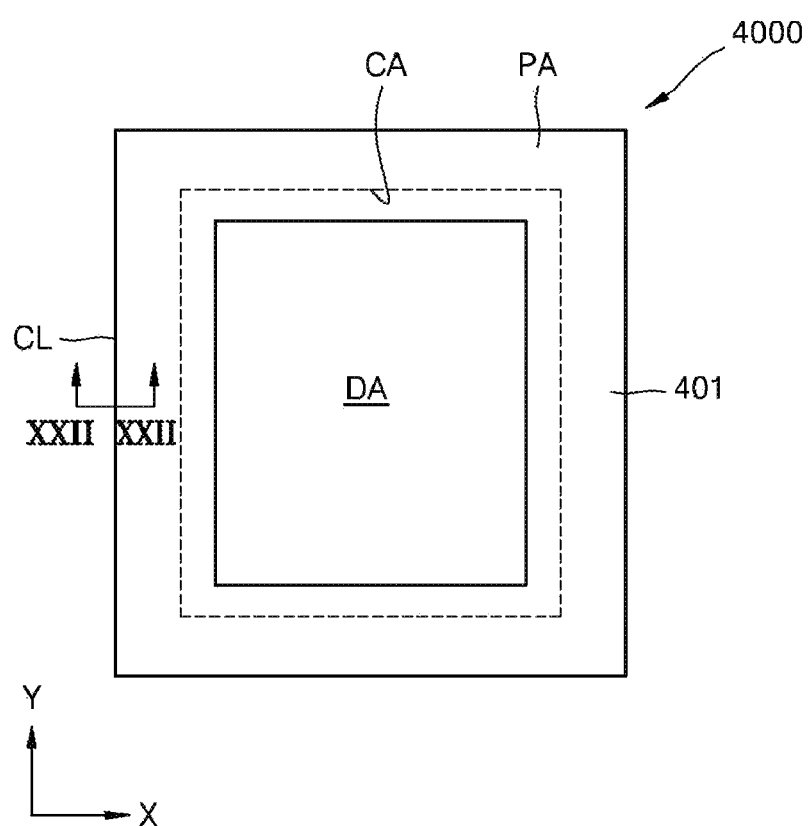
FIG. 22 illustrates a plan view of a display apparatus, according to another embodiment.
Figure 23:
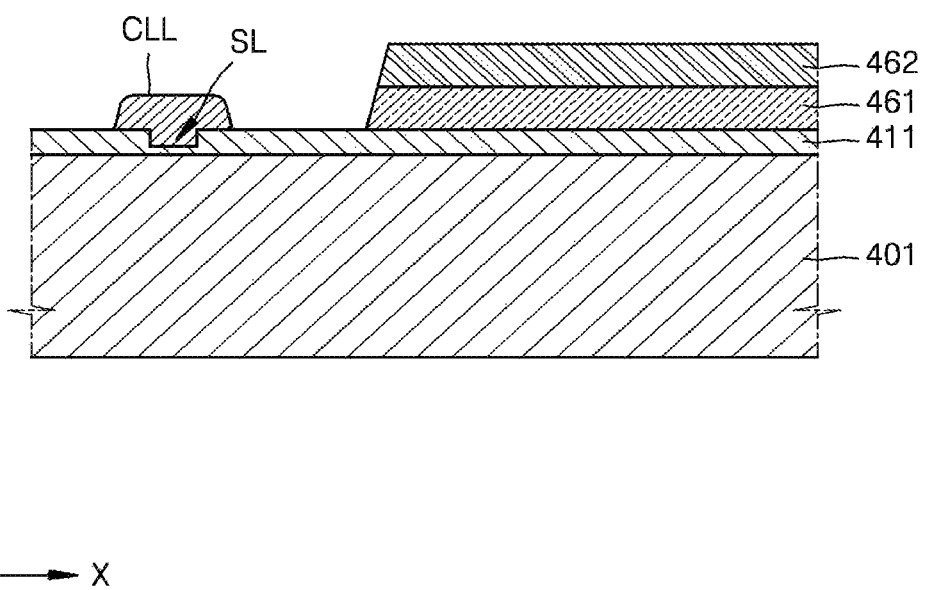
FIG. 23 illustrates a cross-sectional view, taken along a line XXII-XXII of FIG. 22.

FIG. 22 illustrates a plan view of a display apparatus 4000, according to another embodiment. FIG. 23 illustrates a cross-sectional view, taken along a line XXII-XXII of FIG. 22.

Referring to FIGS. 22 and 23, the display apparatus 4000 includes a substrate 401. The substrate 401 may include various materials. Detailed examples of the various materials of the substrate 401 are the same as those described in the previous embodiments, and thus detailed descriptions thereof are omitted here.

A cutting line CL of the display apparatus 4000 is same as in the previous embodiments, and thus detailed descriptions thereof are omitted here.

The substrate 401 is partitioned into a peripheral area PA and a central area CA. The peripheral area PA indicates an area around the cutting line CL, and the central area CA indicates an area that is inwardly positioned, compared to the peripheral area PA. As this is described in the previous embodiment, detailed descriptions thereof are omitted here.

In some embodiments, at least one insulating layer (not shown) may be formed in the display area DA of the central area CA. The insulating layer may include an organic material or an inorganic material.

A first insulating layer 411 is formed on the substrate 401 in the peripheral area PA. A slit SL is formed on the first insulating layer 411. The slit SL is formed in the peripheral area PA so as to be spaced apart from the display area DA.

In the display area DA of the central area CA, at least one encapsulating layer may be formed to decrease or to prevent moisture or foreign substances from penetrating into a display device (not shown) in the display area DA. FIG. 23 illustrates two encapsulating layers 461 and 462, a first inorganic encapsulating layer 461 and a second inorganic encapsulating layer 462. Referring to FIG. 23, the first and second inorganic encapsulating layers 461 and 462 extend from the display area DA to the peripheral area PA. The first inorganic encapsulating layer 461 is formed on the first insulating layer 411, and the second inorganic encapsulating layer 462 is formed on the first inorganic encapsulating layer 461.

The first and second inorganic encapsulating layers 461 and 462 may be spaced apart from the cladding layer CLL and a slit SL.

Although not illustrated, the first and second inorganic encapsulating layers 461 and 462 may not extend to the peripheral area PA and may not overlap with the peripheral area PA.

In some embodiments, one of the first and second inorganic encapsulating layers 461 and 462 may be disposed. In some embodiments, an encapsulating layer (not shown) including an organic material instead of an inorganic material may be formed.

Figure 24:
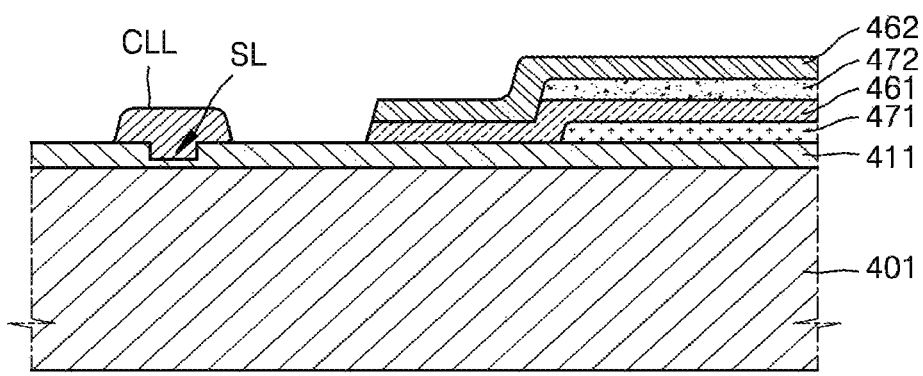
FIG. 24 illustrates a modified example of the display apparatus of FIGS. 22 and 23.

FIG. 24 illustrates a modified example of the display apparatus 4000 of FIGS. 22 and 23.

FIG. 24 illustrates four encapsulating layers: a first inorganic encapsulating layer 461, a second inorganic encapsulating layer 462, a first organic encapsulating layer 471, and a second organic encapsulating layer 472.

Referring to FIG. 24, the four encapsulating layers 461, 462, 471, and 472 extend from the display area DA to the peripheral area PA. The first inorganic encapsulating layer 461 may be formed on the first insulating layer 411, the first organic encapsulating layer 471 may be formed between the first insulating layer 411 and the inorganic encapsulating layer 461, the second inorganic encapsulating layer 462 may be formed on the first inorganic encapsulating layer 461, and the second organic encapsulating layer 472 may be disposed between the first inorganic encapsulating layer 461 and the second inorganic encapsulating layer 462.

A region of a top surface of the first inorganic encapsulating layer 461 that is adjacent to the peripheral area PA may contact a region of a bottom surface of the second inorganic encapsulating layer 462 that is adjacent to the peripheral area PA.

The four encapsulating layers 461, 462, 471, and 472 may be spaced apart from a cladding layer CLL and a slit SL.

Since the four encapsulating layers 461, 462, 471, and 472 are spaced apart from the cladding layer CLL and the slit SL, it is possible to prevent a crack, which may occur in the slit SL, from being propagated via one of the four encapsulating layers 461, 462, 471, and 472, and to prevent a particle, which may remain in the slit SL, from moving via one of the four encapsulating layers 461, 462, 471, and 472.

Although not illustrated, the four encapsulating layers 461, 462, 471, and 472 may not extend to the peripheral area PA and may not overlap with the peripheral area PA.

Figure 25:
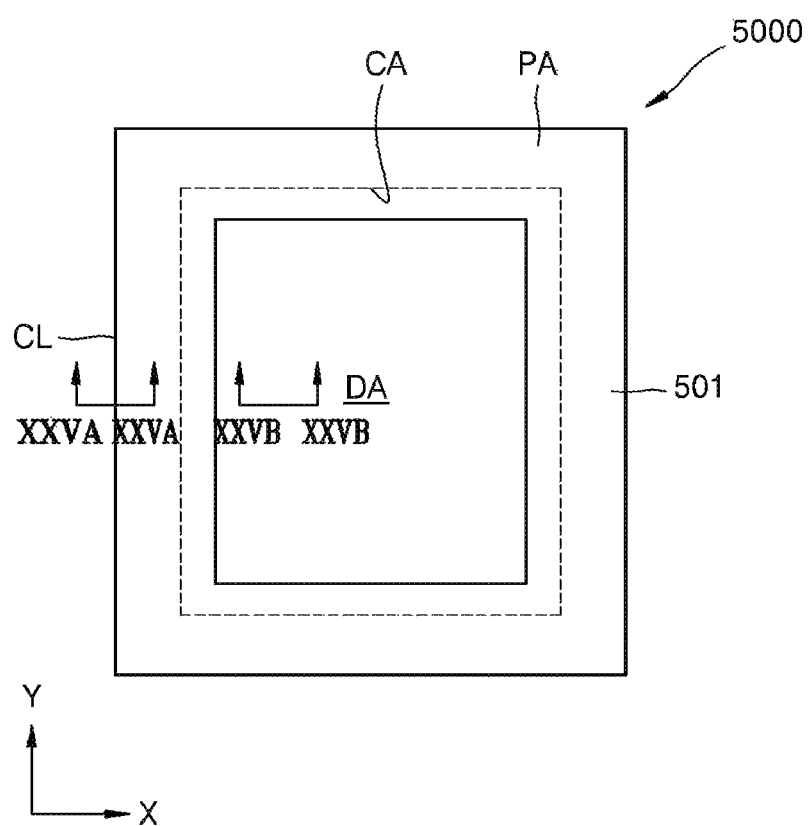
FIG. 25 illustrates a plan view of a display apparatus, according to another embodiment.
Figure 26:
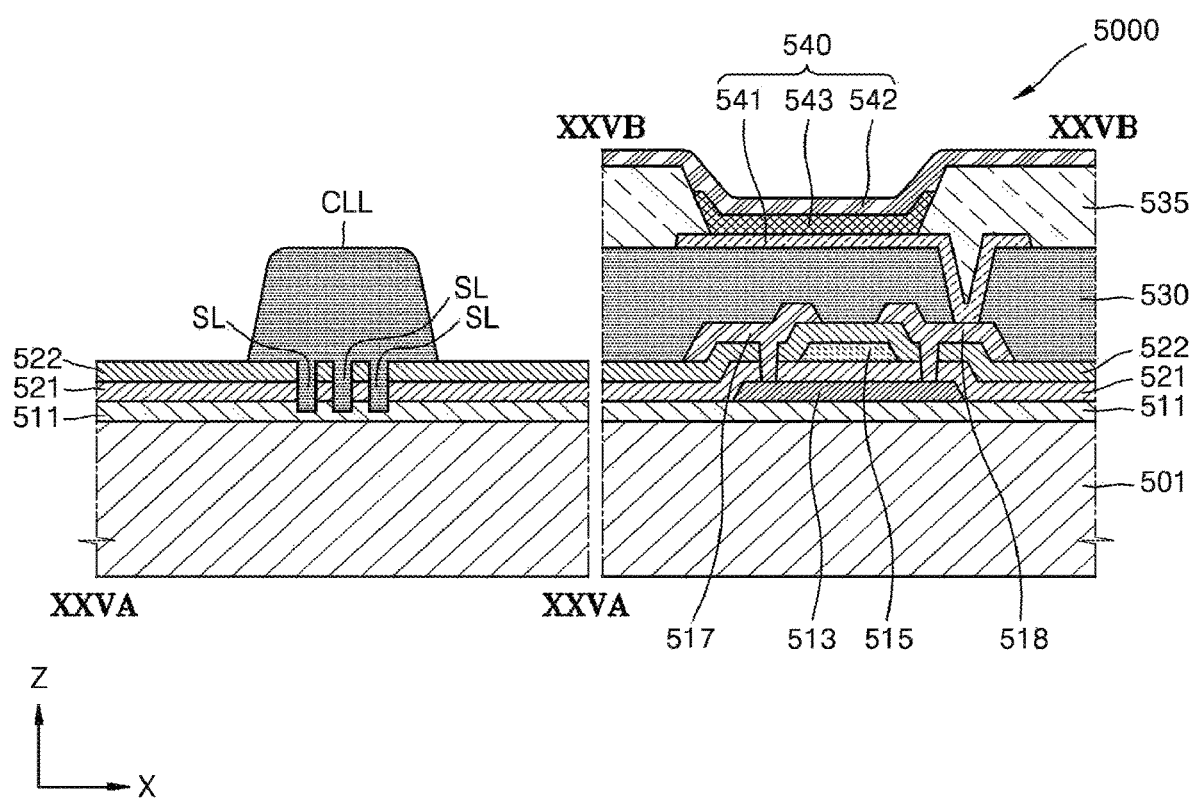
FIG. 26 illustrates cross-sectional views of the display apparatus, taken along lines XXVA-XXVA and XXVB-XXVB of FIG. 25.

FIG. 25 illustrates a plan view of a display apparatus 5000, according to another embodiment. FIG. 26 illustrates cross-sectional views of the display apparatus 5000, taken along lines XXVA-XXVA and XXVB-XXVB of FIG. 25.

Referring to FIGS. 25 and 26, the display apparatus 5000 includes a substrate 501. The substrate 501 may include various materials. Detailed examples of the various materials of the substrate 501 are the same as those described in the previous embodiments, and thus detailed descriptions thereof are omitted here.

A cutting line CL of the display apparatus 5000 is same as in the previous embodiments, and thus detailed descriptions thereof are omitted here.

The substrate 501 is partitioned into a peripheral area PA and a central area CA. The peripheral area PA indicates an area around the cutting line CL, and the central area CA indicates an area that is inwardly positioned, compared to the peripheral area PA. As this is described in the previous embodiments, detailed descriptions thereof are omitted here.

A first insulating layer 511 is formed on the substrate 501. The first insulating layer 511 may include various insulating materials. For example, the first insulating layer 511 may include an inorganic material.

The first insulating layer 511 may be formed in the central area CA and the peripheral area PA. In some embodiments, the first insulating layer 511 may be formed on the substrate 501, without a separate patterning process.

The first insulating layer 511 may include various insulating materials. In some embodiments, the first insulating layer 511 may include the inorganic material. For example, the first insulating layer 511 may include oxide, nitride, or oxynitride. The first insulating layer 511 may include, for example, silicon nitride ($SiN_x$), silicon oxide ($SiO_2$), or silicon oxynitride ($SiO_xN_y$). Also, the first insulating layer 511 may be formed by using various deposition methods including a plasma enhanced chemical vapor deposition (PECVD) method, an atmospheric pressure CVD (APCVD) method, a low pressure CVD (LPCVD) method, or the like.

A thin-film transistor (TFT) may be formed in the display area DA on the first insulating layer 511. The TFT formed in the display area DA functions as a part of a pixel circuit. Also, the TFT may be formed in the non-display area. The TFT that is formed in the non-display area functions as a part of a circuit included in the driver.

In some embodiments, the TFT corresponds to a top gate type TFT in which an active layer 513, a gate electrode 515, a source electrode 517, and a drain electrode 518 are sequentially formed. In other embodiments, various types of a TFT, including a bottom gate type TFT, may be used as the TFT.

The active layer 513 is formed on the first insulating layer 511. The active layer 513 may include a semiconductor material, such as, for example, amorphous silicon or polycrystalline silicon. In some embodiments, the active layer 513 may include various materials. In some embodiments, the active layer 513 may include an organic semiconductor material.

In some embodiments, the active layer 513 may include an oxide semiconductor material. For example, the active layer 513 may include oxide including a material selected from metal elements of groups 12, 13, and 14 such as zinc (Zn), indium (In), gallium (Ga), tin (Sn), cadmium (Cd), germanium (Ge), and hafnium (Hf), or a composition thereof.

As described above, one embodiment may include a bottom gate type TFT. If the active layer 513 includes oxide or amorphous silicon, the embodiment may include the bottom gate type TFT.

The bottom gate type TFT may have various structures. For one example, a gate electrode may be formed on the first insulating layer 511, an active layer may be formed on the gate electrode, and a source electrode and a drain electrode may be disposed on the active layer. As another example, the gate electrode may be formed on a substrate, the source electrode and the drain electrode may be formed on the gate electrode, and the active layer may be formed on the source electrode and the drain electrode. In this case, an insulating layer, such as for example an inorganic layer, may be formed to be adjacent to at least one of the gate electrode, the active layer, and the source electrode and the drain electrode.

A second insulating layer 521 is formed on the active layer 513. The second insulating layer 521 may be formed as multiple layers or a single layer including an inorganic material such as, for example, silicon oxide and/or silicon nitride. The second insulating layer 521 insulates the active layer 513 from the gate electrode 515.

The second insulating layer 521 may be formed in the central area CA and the peripheral area PA. In some embodiments, the second insulating layer 521 may be formed between the active layer 513 and the gate electrode 515, without a separate patterning process.

The gate electrode 515 is disposed on the second insulating layer 521. The gate electrode 515 may be connected to a gate line (not shown) that applies an ON signal or an OFF signal to the TFT.

The gate electrode 515 may include a low resistance metal material. For example, the gate electrode 515 may be formed as multiple layers or a single layer including a conductive material including molybdenum (Mo), aluminum (Al), copper (Cu), or titanium (Ti).

An interlayer insulating layer 522 is formed on the gate electrode 515. The interlayer insulating layer 522 insulates the gate electrode 515 from the source electrode 517 and the drain electrode 518.

The interlayer insulating layer 522 may be formed in the central area CA and the peripheral area PA. In some embodiments, the interlayer insulating layer 522 may be formed between the source and drain electrodes 517 and 518 and the gate electrode 515, without a separate patterning process.

The interlayer insulating layer 522 may be formed as multiple layers or a single layer including an inorganic material. For example, the inorganic material may be metal oxide or metal nitride. In some embodiments, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$).

Before the source and drain electrodes 517 and 518 are formed on the interlayer insulating layer 522, a process of forming contact holes is performed so as to make the source and drain electrodes 517 and 518 contact regions of the active layer 513, respectively. Regions of the second insulating layer 521 and the interlayer insulating layer 522 that are formed on the active layer 513 are removed.

In some embodiments, a process of forming slits SL in the peripheral area PA may be performed when the process of forming the contact holes is performed. The process of removing the regions of the second insulating layer 521 and the interlayer insulating layer 522 on the active layer 513, and the process of forming the slits SL may be simultaneously performed.

Each of the slits SL extends through the second insulating layer 521 and the interlayer insulating layer 522, and corresponds to a predetermined thickness of the first insulating layer 511.

In some embodiments, each of the slits SL may extend through the interlayer insulating layer 522 and may correspond to a part of a thickness of the second insulating layer 521. In some embodiments, each of the slits SL may correspond to a part of a thickness of the interlayer insulating layer 522.

FIG. 26 illustrates a plurality of slits SL, but one slit SL may be formed in other embodiments.

The source and drain electrodes 517 and 518 are formed on the interlayer insulating layer 522. Each of the source electrode 517 and the drain electrode 518 may be formed as a single layer or multiple layers including a highly conductive material.

The source electrode 517 and the drain electrode 518 are formed to contact the active layer 513. Some metal materials for forming the source electrode 517 and the drain electrode 518 may remain in the slits SL.

A passivation layer 530 is formed on the source electrode 517 and the drain electrode 518 so as to cover the TFT.

The passivation layer 530 may remove a step caused by the TFT, provide a planarized layer over the TFT, and thus prevents occurrence of a defect in an OLED 540 due to unevenness due to the TFT. The passivation layer 530 may be formed as a single layer or multiple layers including an organic material. The organic material may include polymer derivatives having commercial polymers such as, for example, Polymethylmethacrylate (PMMA) or Polystyrene (PS), and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof. Also, the passivation layer 530 may be formed as a multi-stack including an inorganic insulating layer and an organic insulating layer.

In some embodiments, a cladding layer CLL may include a same material as the passivation layer 530. The cladding layer CLL may include an organic material.

In some embodiments, the passivation layer 530 and the cladding layer CLL may be simultaneously formed. When the passivation layer 530 is formed, a via hole forming process is performed to expose a surface of one of the source electrode 517 and the drain electrode 518, and the via hole forming process may be performed and simultaneously, the cladding layer CLL may be patterned. The cladding layer CLL may be easily formed without using an additional mask.

The cladding layer CLL may cover the slits SL, and thus may decrease or prevent movement of particles that may remain in the slits SL. By doing so, an electrical defect including a short defect of the OLED 540 in the display area DA may be decreased.

The OLED 540 is formed on the passivation layer 530. The OLED 540 is electrically connected to the TFT.

The OLED 540 includes a first electrode 541, a second electrode 542, and an intermediate layer 543 disposed between the first electrode 541 and the second electrode 542.

The first electrode 541 is electrically connected to one of the source electrode 517 and the drain electrode 518. Referring to FIG. 26, the first electrode 541 may be electrically connected to the drain electrode 518.

The first electrode 541 may have one of various forms. For example, the first electrode 541 may be patterned as an island form.

The first electrode 541 may include various materials. The first electrode 541 may include at least one transparent conductive oxide material, such as for example, indium tin oxide (ITO), indium zinc oxide (IZO), zinc oxide (ZnO), indium oxide ($In_2O_3$), indium gallium oxide (IGO), or aluminum zinc oxide (AZO). The first electrode 541 may include a metal, such as for example silver (Ag), having high reflectance.

The intermediate layer 543 may include an organic emission layer including a small molecular organic material or a polymer molecular organic material. In some embodiments, the intermediate layer 543 includes the organic emission layer and may further include one or more of a hole injection layer, a hole transport layer, an electron transport layer, and an electron injection layer.

The organic emission layer may be formed in each of OLEDs. In this case, the OLEDs may emit red light, green light, and blue light, respectively. In some embodiments, the organic emission layer may be commonly formed in the OLEDs. For example, a plurality of organic emission layers that emit red light, green light, and blue light may be vertically stacked or mixed and thus may emit white light. Color combinations for emitting white light are not limited to the aforementioned description. A color conversion layer or a color filter may be separately arranged to convert the emitted white light to a predetermined color.

The second electrode 542 may include various conductive materials. For example, the second electrode 542 may be formed as multiple layers or a single layer including at least one of lithium (Li), calcium (Ca), lithium fluoride (LiF), aluminum (Al), magnesium (Mg), silver (Ag), or an alloy including at least two of these materials.

A pixel-defining layer 535 is formed on the passivation layer 530. The pixel-defining layer 535 is formed while not covering a predetermined region of the first electrode 541, the intermediate layer 543 is formed on the predetermined region of the first electrode 541 that is not covered by the pixel-defining layer 535, and the second electrode 542 is formed on the intermediate layer 543.

The pixel-defining layer 535 may include at least one inorganic insulating material such as for example, polyimide, polyamide, an acryl resin, benzocyclobutene, or a phenol resin, and may be formed by using a spin coating method.

In some embodiments, the cladding layer CLL may include a same material as the pixel-defining layer 535.

Although not illustrated on the second electrode 542, in some embodiments, a functional layer (not shown) may be further formed thereon. The functional layer may include a plurality of layers formed on the second electrode 542. At least one layer of the functional layer may prevent the second electrode 542 from being contaminated in a subsequent process, and another layer of the functional layer may improve an efficiency of a visible ray that is discharged from the intermediate layer 543 to the second electrode 542.

The slits SL in the first insulating layer 111 arranged in the peripheral area PA of the display apparatus 5000 prevent a crack that is propagated from an edge of the substrate 501. For example, the slit SL that is adjacent to the cutting line CL of the substrate 501 primarily prevents propagation of a crack that may occur on the substrate 501 when each display apparatus 5000 is cut and separated from the mother substrate.

When the substrate 501 includes a flexible material and thus the display apparatus 5000 has flexibility, the slits SL may efficiently decrease or prevent crack occurrence and propagation in the peripheral area PA while a curving or bending motion occurs at the peripheral area PA.

A cladding layer CLL is formed on the slits SL. Due to the cladding layer CLL, movement of foreign substances or particles that may remain in the slits SL may be prevented. In some embodiments, the cladding layer CLL may cover the slits SL, so that the foreign substances or the particles that may remain in the slits SL may not be exposed.

Due to the first insulating layer 511, the cladding layer CLL may not be delaminated from the substrate 501.

The cladding layer CLL may include the same material as the passivation layer 530 in the central area CA, and in some embodiments, while the passivation layer 530 is formed, a via hole forming process and a cladding layer forming process may be simultaneously performed. Thus, the cladding layer CLL may be easily formed, and a patterning process using a separate mask may not be added.

Embodiments may include one of various types of TFTs, and in some embodiments, the cladding layer CLL may include a same material as an insulating layer of the TFT, the insulating layer being adjacent to one of an active layer, a gate electrode, a source electrode, and a drain electrode. In some embodiments, the cladding layer CLL and the insulating layer of the TFT may be simultaneously formed.

Figure 27:
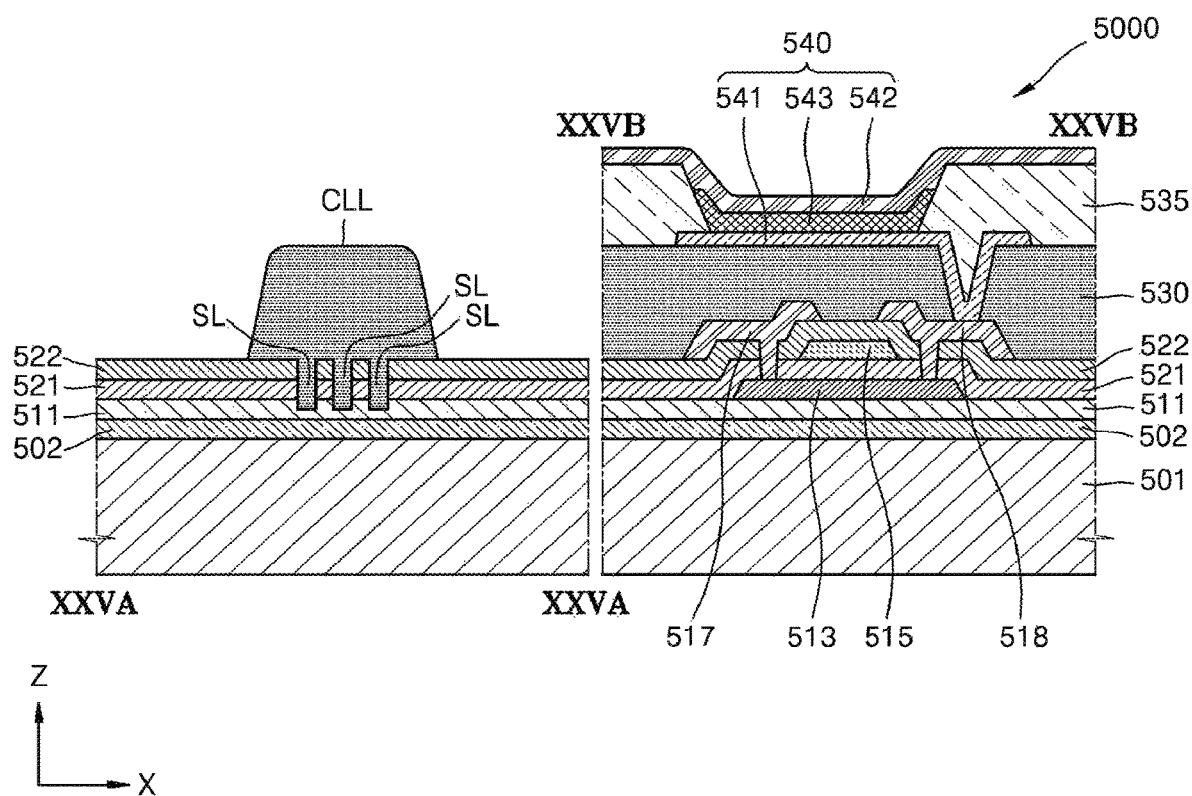
FIG. 27 illustrates a modified example of the display apparatus shown in FIGS. and 26.

FIG. 27 illustrates a modified example of the display apparatus 5000 shown in FIGS. 25 and 26.

For convenience of description, the present embodiment will be described with respect to differences from the previous embodiments.

Referring to FIG. 27, the display apparatus 5000 includes a barrier layer 502 between the substrate 501 and the first insulating layer 511.

The barrier layer 502 may decrease or prevent moisture or foreign substances from penetrating into the display apparatus 5000 via the substrate 501. Since slits SL are not formed in the barrier layer 502, the barrier layer 502 may decrease or prevent the moisture or the foreign substances from penetrating toward the slits SL.

In some embodiments, each of the slits SL may have a depth greater than that shown in FIG. 27, and thus may be formed even in the barrier layer 502.

The barrier layer 502 may include silicon nitride ($SiN_x$), silicon oxide ($SiO_2$), or silicon oxynitride ($SiO_xN_y$).

Figure 28:
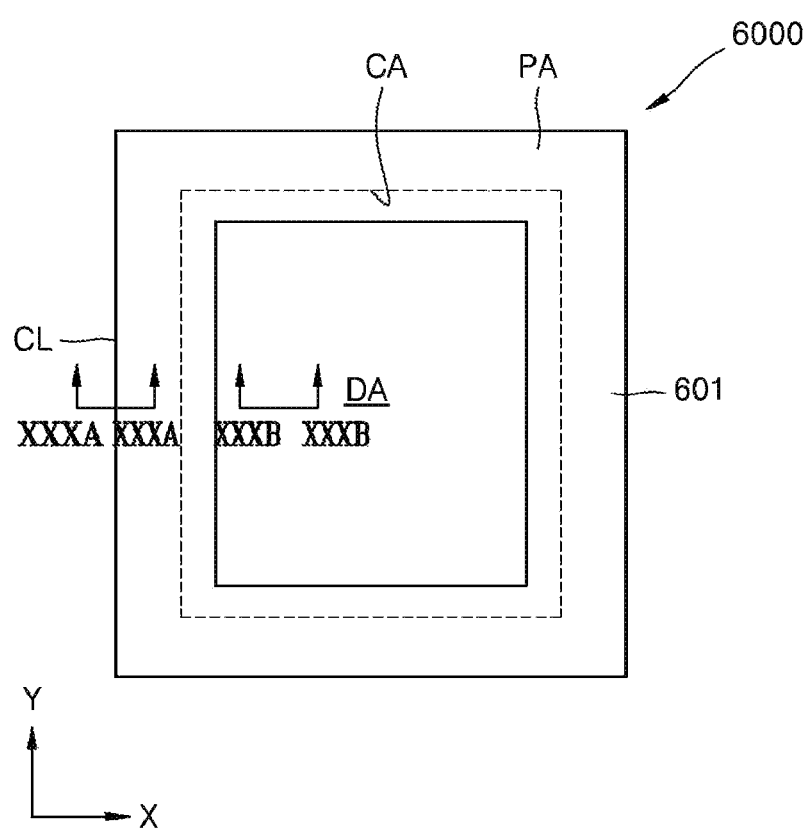
FIG. 28 illustrates a plan view of a display apparatus, according to another embodiment.
Figure 29:
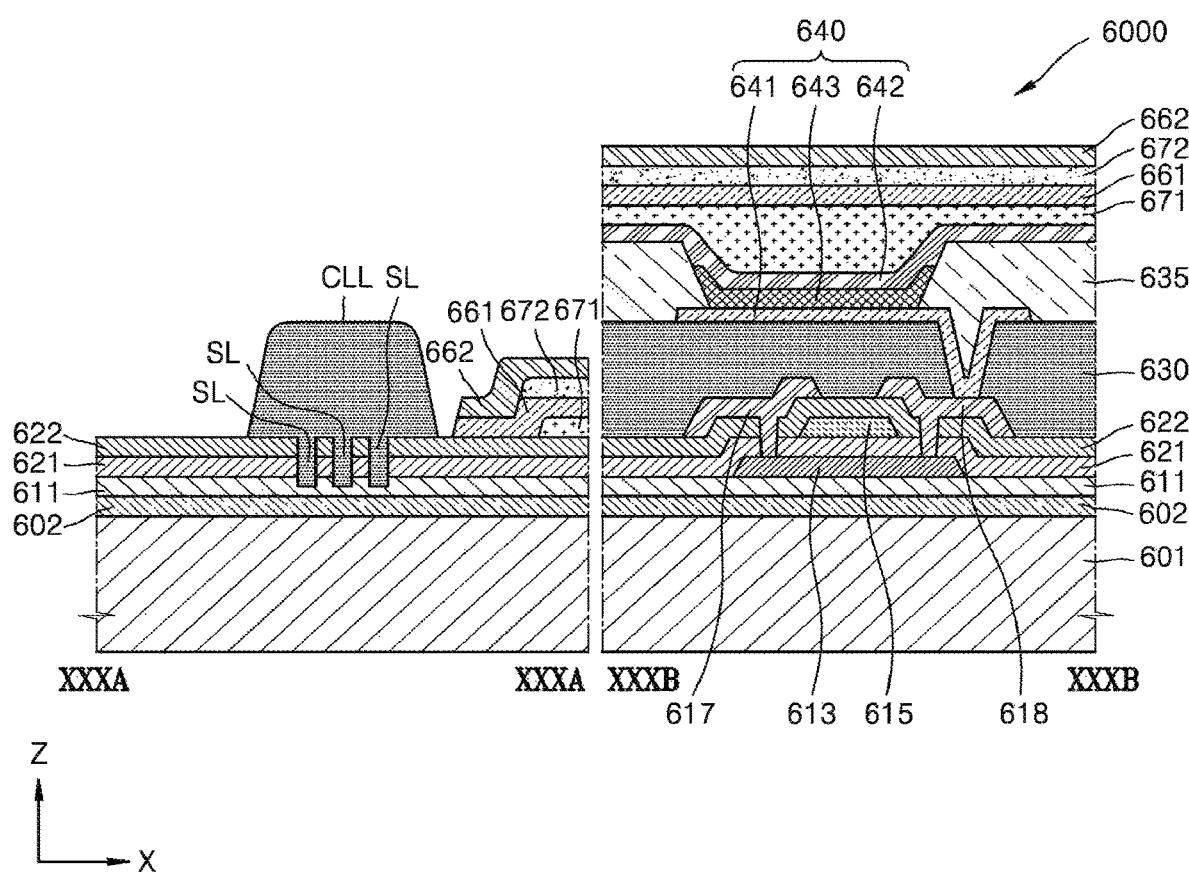
FIG. 29 illustrates a cross-sectional view, taken along lines XXXA-XXXA and XXXB-XXXB of FIG. 28.

FIG. 28 illustrates a plan view of a display apparatus 6000, according to another embodiment. FIG. 29 illustrates a cross-sectional view, taken along lines XXXA-XXXA and XXXB-XXXB of FIG. 28.

Referring to FIGS. 28 and 29, the display apparatus 6000 includes a substrate 601. The substrate 601 may include various materials. Detailed examples of the various materials of the substrate 601 are the same as those described in the previous embodiments, and thus detailed descriptions thereof are omitted here.

A cutting line CL of the display apparatus 6000 is same as in the previous embodiments, and thus detailed descriptions thereof are omitted here.

The substrate 601 is partitioned into a peripheral area PA and a central area CA. The peripheral area PA indicates an area adjacent to the cutting line CL, and the central area CA indicates an area that is inwardly positioned, compared to the peripheral area PA. As this is described in the previous embodiments, detailed descriptions thereof are omitted here.

A barrier layer 602 is formed between the substrate 601 and a first insulating layer 611.

The barrier layer 602 may decrease or prevent moisture or foreign substances from penetrating into the display apparatus 6000 via the substrate 601. Since slits SL are not formed in the barrier layer 602, the barrier layer 602 may decrease or prevent the moisture or the foreign substances from penetrating toward the slits SL.

In some embodiments, each of the slits SL may have a depth greater than that shown in FIG. 29, and thus may be formed even in the barrier layer 602.

The barrier layer 602 may include silicon nitride ($SiN_x$), silicon oxide ($SiO_2$), or silicon oxynitride ($SiO_xN_y$).

The first insulating layer 611 is formed on the barrier layer 602. The first insulating layer 611 may include various insulating materials. For example, the first insulating layer 611 may include an inorganic material.

The first insulating layer 611 may be formed in the central area CA and the peripheral area PA. In some embodiments, the first insulating layer 611 may be formed on the substrate 601 without a separate patterning process.

The first insulating layer 611 may include various insulating materials. For example, the first insulating layer 611 may include an inorganic material. For example, the first insulating layer 611 may include oxide, nitride, or oxynitride. The first insulating layer 611 may include, for example, silicon nitride ($SiN_x$), silicon oxide ($SiO_2$), or silicon oxynitride ($SiO_xN_y$). Also, the first insulating layer 611 may be formed by using various deposition methods including a PECVD method, an APCVD method, an LPCVD method, or the like.

A TFT may be formed in the display area DA on the first insulating layer 611. The TFT formed in the display area DA functions as a part of a pixel circuit. Also, the TFT may be formed in a non-display area. The TFT that is formed in the non-display area functions as a part of a circuit included in a driver.

In some embodiments, the TFT corresponds to a top gate type TFT in which an active layer 613, a gate electrode 615, a source electrode 617, and a drain electrode 618 are sequentially formed. In other embodiments, various types of TFTs, including a bottom gate type TFT may be applied to the TFT.

The active layer 613 is formed on the first insulating layer 611. A material for forming the first insulating layer 611 is described in the previous embodiments and thus detailed descriptions thereof are omitted here.

A second insulating layer 621 is formed on the active layer 613. The second insulating layer 621 may be formed as multiple layers or a single layer including an inorganic material such as, for example, silicon oxide and/or silicon nitride. The second insulating layer 621 may be formed in the central area CA and the peripheral area PA. In some embodiments, the second insulating layer 621 may be formed between the active layer 613 and the gate electrode 615, without a separate patterning process.

The gate electrode 615 is disposed on the second insulating layer 621. The gate electrode 615 may be connected to a gate line (not shown) that applies an ON signal or an OFF signal to the TFT.

An interlayer insulating layer 622 is formed on the gate electrode 615. The interlayer insulating layer 622 insulates the gate electrode 615 from the source electrode 617 and the drain electrode 618.

The interlayer insulating layer 622 may be formed in the central area CA and the peripheral area PA. In some embodiments, the interlayer insulating layer 622 may be formed between the source and drain electrodes 617 and 618 and the gate electrode 615, without a separate patterning process.

The interlayer insulating layer 622 may be formed as multiple layers or a single layer including an inorganic material. For example, the inorganic material may be metal oxide or metal nitride. The inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$).

Before the source and drain electrodes 617 and 618 are formed on the interlayer insulating layer 622, a process of forming contact holes is performed so as to make the source and drain electrodes 617 and 618 contact regions of the active layer 613, respectively. Regions of the second insulating layer 621 and the interlayer insulating layer 622 that are formed on the active layer 613 are removed.

In some embodiments, a process of forming slits SL in the peripheral area PA may be performed when the process of forming the contact holes is performed. The process of removing the regions of the second insulating layer 621 and the interlayer insulating layer 622 on the active layer 613, and the process of forming the slits SL may be simultaneously performed.

Each of the slits SL extends through the second insulating layer 621 and the interlayer insulating layer 622, and corresponds to a predetermined thickness of the first insulating layer 611.

In some embodiments, each of the slits SL may extend through the interlayer insulating layer 622 and may correspond to a part of a thickness of the second insulating layer 621. In some embodiments, each of the slits SL may correspond to a part of a thickness of the interlayer insulating layer 622.

FIG. 29 illustrates a plurality of slits SL, but one slit SL may be formed in some embodiments.

The source and drain electrodes 617 and 618 are formed on the interlayer insulating layer 622. Each of the source electrode 617 and the drain electrode 618 may be formed as a single layer or multiple layers including a highly conductive material.

The source electrode 617 and the drain electrode 618 are formed to contact the active layer 613. Some metal materials for forming the source electrode 617 and the drain electrode 618 may remain in the slits SL.

A passivation layer 630 is formed on the source electrode 617 and the drain electrode 618 so as to cover the TFT.

The passivation layer 630 may remove a step caused by the TFT, provide a planarized layer over the TFT, and thus prevent occurrence of a defect in an OLED 640 due to unevenness due to the TFT. The passivation layer 630 may be formed as a single layer or multiple layers including an organic material. The organic material may include polymer derivatives having commercial polymers such as, for example, Polymethylmethacrylate (PMMA) or Polystyrene (PS), and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof. The passivation layer 630 may be formed as a multi-stack including an inorganic insulating layer and an organic insulating layer.

In some embodiments, a cladding layer CLL may include a same material as the passivation layer 630. The cladding layer CLL may include an organic material.

In some embodiments, the passivation layer 630 and the cladding layer CLL may be simultaneously formed. When the passivation layer 630 is formed, a via hole forming process is performed to expose a surface of one of the source electrode 617 and the drain electrode 618, and the via hole forming process may be performed and simultaneously, the cladding layer CLL may be patterned. The cladding layer CLL may be easily formed without using an additional mask.

The OLED 640 is formed on the passivation layer 630. The OLED 640 is electrically connected to the TFT.

The OLED 640 includes a first electrode 641, a second electrode 642, and an intermediate layer 643 disposed between the first electrode 641 and the second electrode 642.

The first electrode 641 is electrically connected to one of the source electrode 617 and the drain electrode 618. Referring to FIG. 29, the first electrode 641 may be electrically connected to the drain electrode 618.

The first electrode 641 may have one of various forms. For example, the first electrode 641 may be patterned as an island form.

The first electrode 641 may include various materials. The first electrode 641 may include at least one transparent conductive oxide material, including indium tin oxide (ITO), indium zinc oxide (IZO), zinc oxide (ZnO), indium oxide ($In_2O_3$), indium gallium oxide (IGO), or aluminum zinc oxide (AZO). Also, the first electrode 641 may include metal, such as silver (Ag), having high reflectance.

The intermediate layer 643 may include an organic emission layer including a small molecular organic material or a polymer molecular organic material. In some embodiments, the intermediate layer 643 includes the organic emission layer and may further include at least one of a hole injection layer, a hole transport layer, an electron transport layer, or an electron injection layer.

The organic emission layer may be formed in each of OLEDs. The OLEDs may emit red light, green light, and blue light, respectively. In other embodiments, the organic emission layer may be commonly formed in the OLEDs. For example, a plurality of organic emission layers that emit red light, green light, and blue light may be vertically stacked or mixed and thus may emit white light. Color combinations for emitting white light are not limited to the aforementioned description. A color conversion layer or a color filter may be separately arranged to convert the emitted white light to a predetermined color.

The second electrode 642 may include various conductive materials. For example, the second electrode 642 may be formed as multiple layers or a single layer including at least one of lithium (Li), calcium (Ca), lithium fluoride (LiF), aluminum (Al), magnesium (Mg), silver (Ag), or an alloy including at least two of these materials.

A pixel-defining layer 635 is formed on the passivation layer 630. The pixel-defining layer 635 is formed while not covering a predetermined region of the first electrode 641, the intermediate layer 643 is formed on the predetermined region of the first electrode 641 that is not covered by the pixel-defining layer 635, and the second electrode 642 is formed on the intermediate layer 643.

The pixel-defining layer 635 may include at least one inorganic insulating material such as polyimide, polyamide, an acryl resin, benzocyclobutene, or a phenol resin, and be formed by using a spin coating method.

In some embodiments, the cladding layer CLL may include a same material as the pixel-defining layer 635.

Although not illustrated on the second electrode 642, in some embodiments, a functional layer (not shown) may be further formed thereon. The functional layer may include a plurality of layers formed on the second electrode 642. At least one layer of the functional layer may prevent the second electrode 642 from being contaminated in a subsequent process, and another layer of the functional layer may improve an efficiency of a visible ray that is discharged from the intermediate layer 643 to the second electrode 642.

One or more encapsulating layers 661, 662, 671, and 672 may be formed on the second electrode 642 so as to decrease or to prevent moisture or foreign substances from penetrating to the OLED 640.

FIG. 29 illustrates four encapsulating layers: a first inorganic encapsulating layer 661, a second inorganic encapsulating layer 662, a first organic encapsulating layer 671, and a second organic encapsulating layer 672.

The first inorganic encapsulating layer 661 is formed on the first organic encapsulating layer 671, the second organic encapsulating layer 672 is formed on the first inorganic encapsulating layer 661, and the second inorganic encapsulating layer 662 is formed on the second organic encapsulating layer 672.

A region of the first inorganic encapsulating layer 661 and a region of the second inorganic encapsulating layer 662 may contact each other. Widths of the first inorganic encapsulating layer 661 and the second inorganic encapsulating layer 662 may extend in one direction so as to be greater than widths of the first organic encapsulating layer 671 and the second organic encapsulating layer 672. In some embodiments, complete areas of the first inorganic encapsulating layer 661 and the second inorganic encapsulating layer 662 may be larger than complete areas of the first organic encapsulating layer 671 and the second organic encapsulating layer 672.

In some embodiments, at least one of the four encapsulating layers 661, 662, 671, and 672 may be skipped, and in some embodiments, the display apparatus 6000 may further include at least an additional organic encapsulating layer or an additional inorganic encapsulating layer.

The first organic encapsulating layer 671 and the second organic encapsulating layer 672 may include various organic materials including an acryl-based material, an epoxy-based material, a PI-based material, or the like.

The first inorganic encapsulating layer 661 and the second inorganic encapsulating layer 662 may include various inorganic materials including metal oxide such as, for example, $Al_2O_3$, $TiO_2$, MgO or CrO. In some embodiments, the first inorganic encapsulating layer 661 and the second inorganic encapsulating layer 662 may include a silicon-based material such as, for example, $SiN_x$, SiON or $SiO_2$ or other ceramic materials.

The four encapsulating layers 661, 662, 671, and 672 may extend from the display area DA to the peripheral area PA.

The four encapsulating layers 661, 662, 671, and 672 may be spaced apart from the cladding layer CLL and the slits SL.

In some embodiments, the four encapsulating layers 661, 662, 671, and 672 may not extend to the peripheral area PA and may not overlap with the peripheral area PA.

In some embodiments, the cladding layer CLL and at least one of the four encapsulating layers 661, 662, 671, and 672 may include a same material.

FIGS. 30 through 33 illustrate plan views of a display apparatus 7000, according to another embodiment.

Referring to FIGS. 30 through 33, the display apparatus 7000 includes a display area DA and a cladding layer CLL on a substrate 701. A structure of the display apparatus 7000 shown in FIGS. 30 through 33 may be applied to the previous embodiments and one or more embodiments described below.

For convenience of description, detailed descriptions about elements other than the cladding layer CLL are omitted here.

Figure 30:
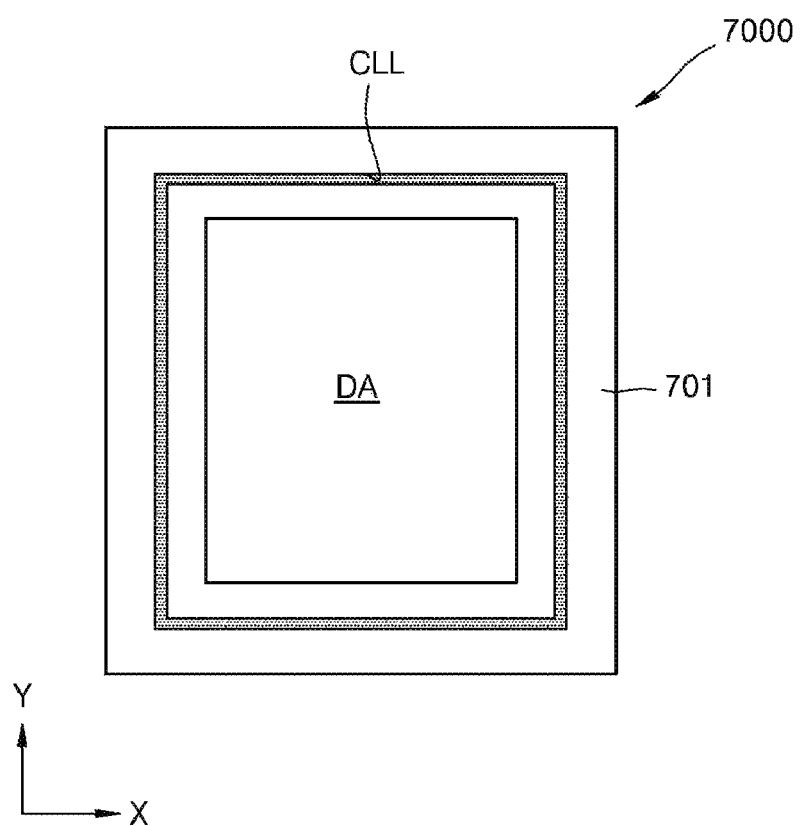
FIGS. 30 through 33 illustrate plan views of a display apparatus, according to another embodiment.

Referring to FIG. 30, the cladding layer CLL may surround the display area DA and may have edges that are parallel to edges of the substrate 701.

Figure 31:
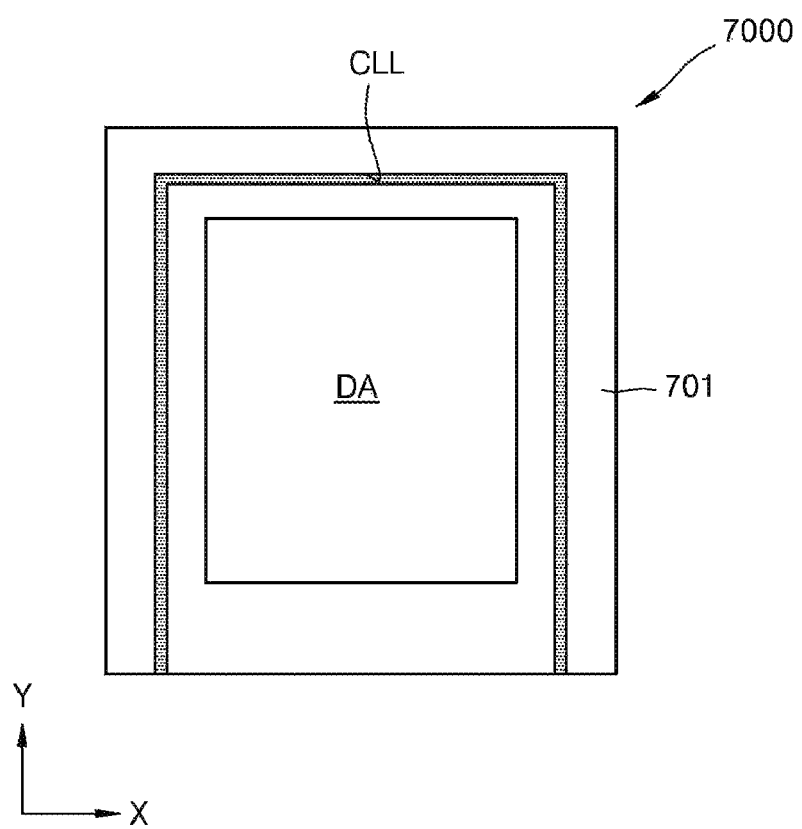

Referring to FIG. 31, edges of the cladding layer CLL may correspond to edges of the display area DA, except for one edge of the display area DA.

Figure 32:
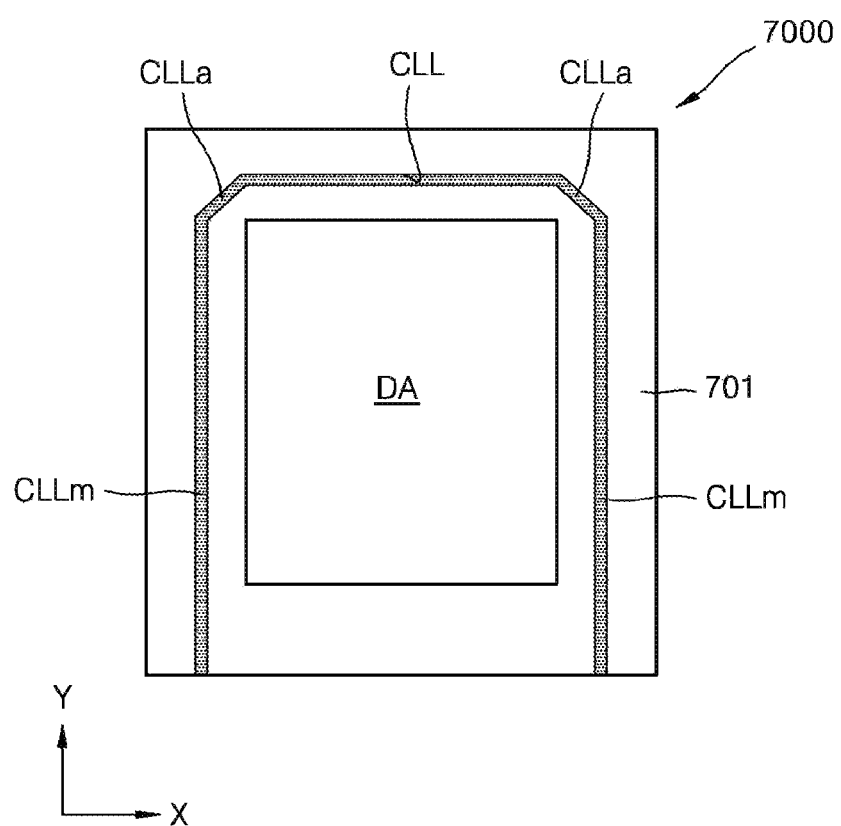

Referring to FIG. 32, edges of the cladding layer CLL may correspond to edges of the display area DA, except for one edge of the display area DA.

As illustrated in FIG. 32, the cladding layer CLL may include one or more main portions CLLm that correspond to edges of the substrate 701, and may include at least one corner portion CLLa that connects two adjacent main portions CLLm. In some embodiments, the corner portion CLLa may correspond to a corner of the substrate 701.

Figure 33:
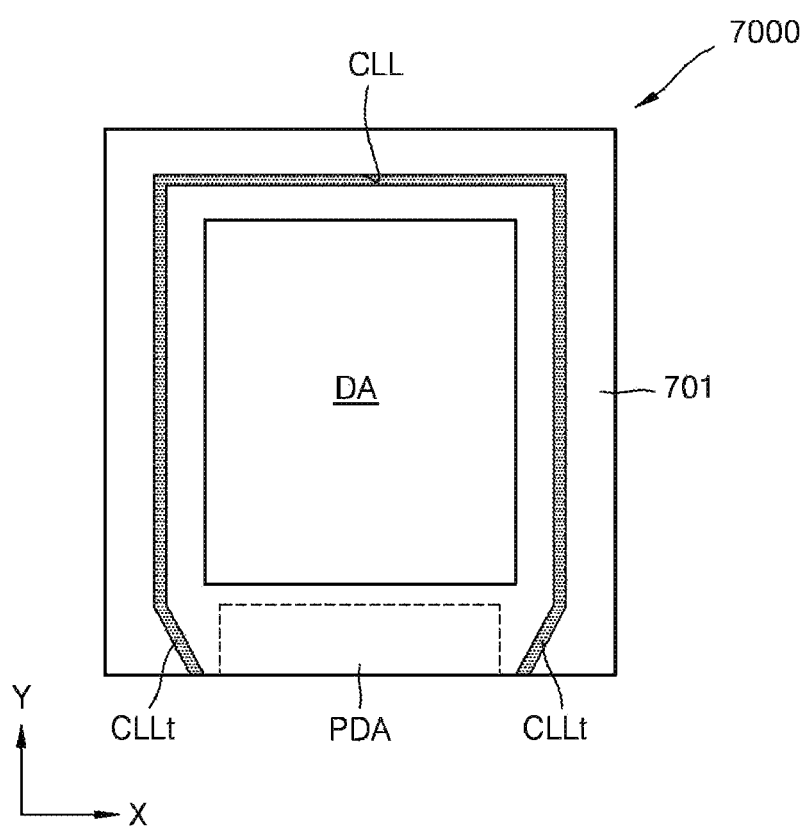

Also, as illustrated in FIG. 33, when a pad area PDA is formed in an area outside the display area DA of the substrate 701, the cladding layer CLL may be formed near the pad area PDA while the cladding layer CLL is spaced apart from the pad area PDA. The cladding layer CLL may include curved portions CLLt according to a shape of the pad area PDA. Referring to FIG. 33, the curved portions CLLt are curved toward the display area DA. However, in some embodiments, the curved portions CLLt may be curved away from the display area DA.

Figure 34:
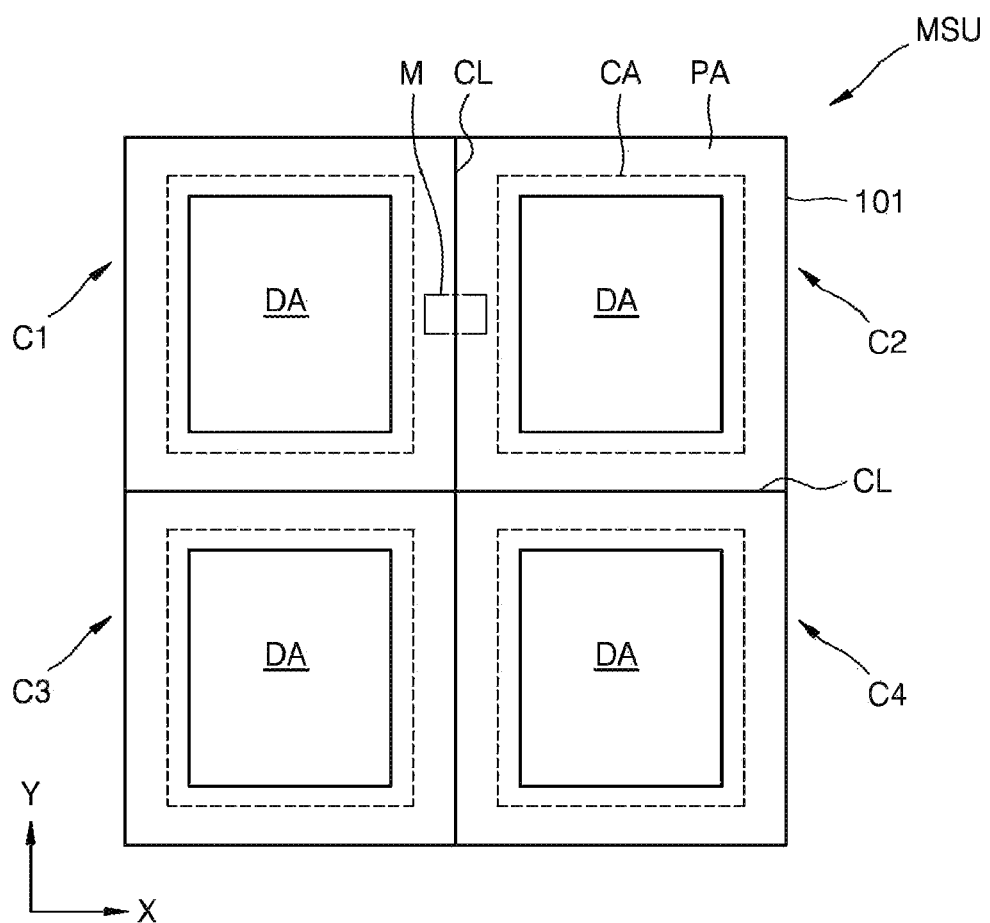
FIG. 34 illustrates a plan view of a mother substrate used in manufacturing a display apparatus, according to an embodiment.
Figure 35:
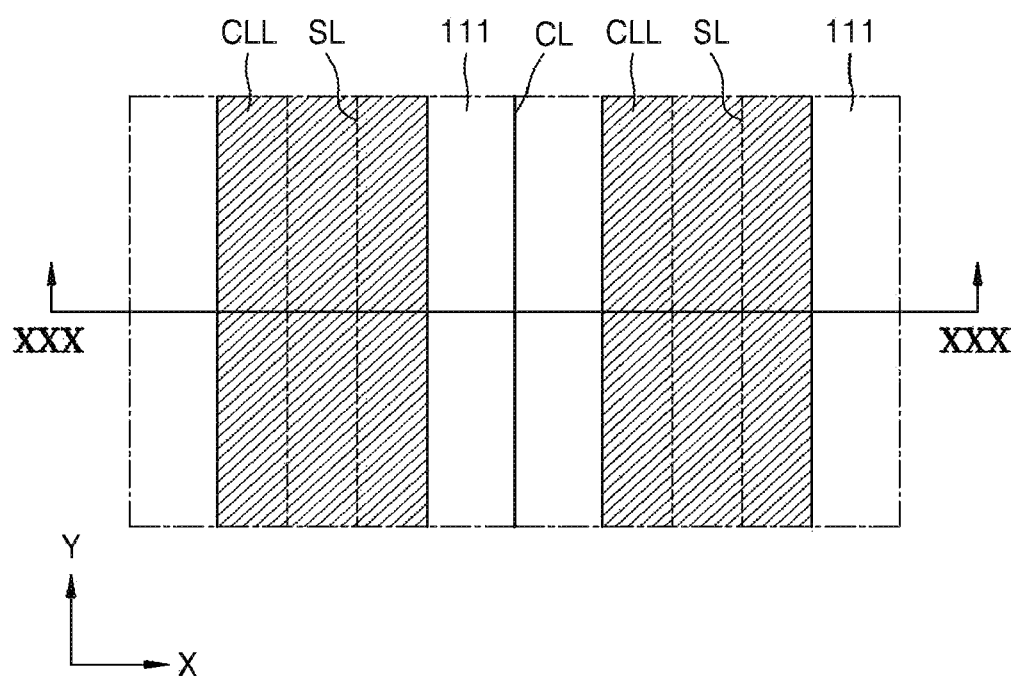
FIG. 35 illustrates a magnified plan view of a portion M of FIG. 34.
Figure 36:
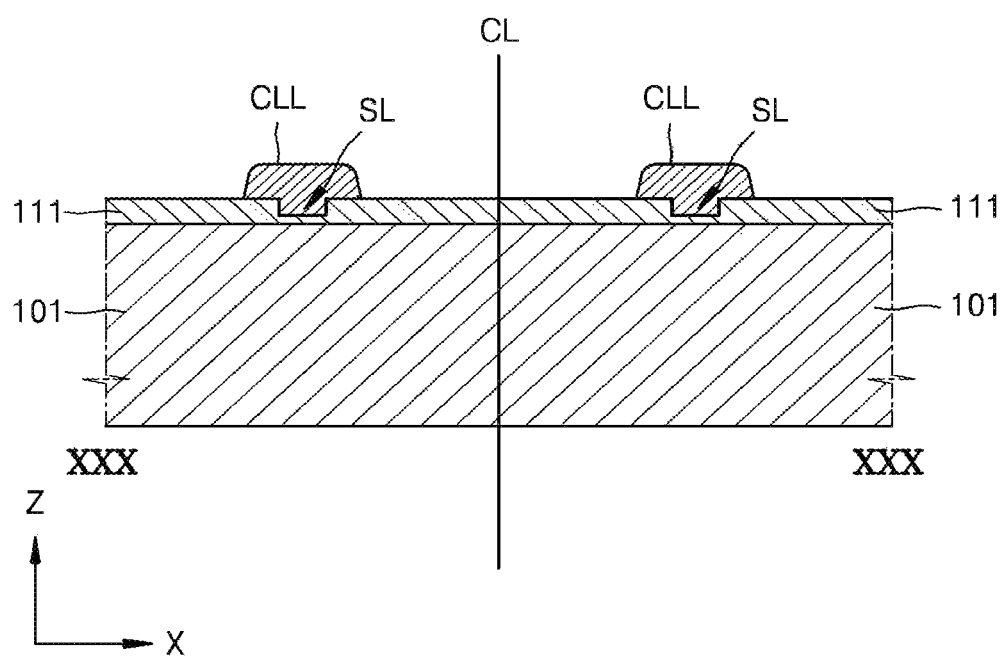
FIG. 36 illustrates a cross-sectional view of the portion M, taken along a line XXX-XXX of FIG. 35.

FIG. 34 illustrates a plan view of a mother substrate MSU used in manufacturing a display apparatus, according to an embodiment. FIG. 35 illustrates a magnified plan view of a portion M of FIG. 34, and FIG. 36 illustrates a cross-sectional view of the portion M, taken along a line XXX-XXX of FIG. 35.

Referring to FIG. 34, a plurality of cells C1, C2, C3, and C4 are disposed on the mother substrate MSU. The plurality of cells C1, C2, C3, and C4 correspond to display apparatuses, respectively.

The mother substrate MSU is cut along cutting lines CL and thus the plurality of cells C1, C2, C3, and C4 are separated. Afterward, four display apparatuses are manufactured via subsequent processes. Each of the manufactured four display apparatuses may be one of the display apparatuses according to the previously described embodiments.

The mother substrate MSU includes the substrate 101.

The substrate 101 may include various materials. Detailed examples of the various materials of the substrate 101 are the same as those described in the previous embodiments, and thus detailed descriptions thereof are omitted here.

Each of the plurality of cells C1, C2, C3, and C4 of the mother substrate MSU is partitioned into a peripheral area PA and a central area CA. The peripheral area PA indicates an area adjacent to the cutting line CL, and the central area CA indicates an area that is inwardly positioned, compared to the peripheral area PA.

The central area CA may include at least one display area DA.

The display area DA may have at least one display device (not shown), such as for example an OLED, for displaying an image. Also, a plurality of pixels may be arranged in the display area DA.

A non-display area (not shown) may be formed around the display area DA. The non-display area may be formed to surround the display area DA. In some embodiments, the non-display area may be formed to be adjacent to a plurality of sides of the display area DA. In some embodiments, the non-display area may be formed to be adjacent to one side of the display area DA.

In some embodiments, only the display area DA may be arranged in the central area CA. The non-display area may be formed only in the peripheral area PA.

A pad area (not shown) may be formed in the non-display area. A driver or a plurality of pad units (not shown) may be disposed in the pad area.

The peripheral area PA indicates the area around the cutting line CL, and may be arranged in side ends of the mother substrate MSU, along the cutting line CL.

The first insulating layer 111 is formed on the substrate 101 in the peripheral area PA. The slit SL is formed on the first insulating layer 111. The slit SL is formed in the peripheral area PA so as to be spaced apart from the display area DA.

The slit SL may be spaced apart from the cutting line CL. The cladding layer CLL is formed on the first insulating layer 111 so as to cover the slit SL. The cladding layer CLL may be spaced apart from the cutting line CL.

Movement of a crack that may occur on the first insulating layer 111 during a cutting process performed along the cutting lines CL may be prevented or may be decreased due to the slit SL. Also, movement of particles that may remain in the slit SL may be prevented or may be decreased due to the cladding layer CLL, so that an electrical defect that may occur in the display apparatus may be prevented.

Since the first insulating layer 111 and the cladding layer CLL contact each other, it is possible to prevent the cladding layer CLL from being delaminated from the substrate 101.

For convenience of description, a structure of the display apparatus 1000 shown in FIG. 1 is applied to the present embodiment, and a structure of any one of the previous embodiments may be applied to the present embodiment.

Figure 37:
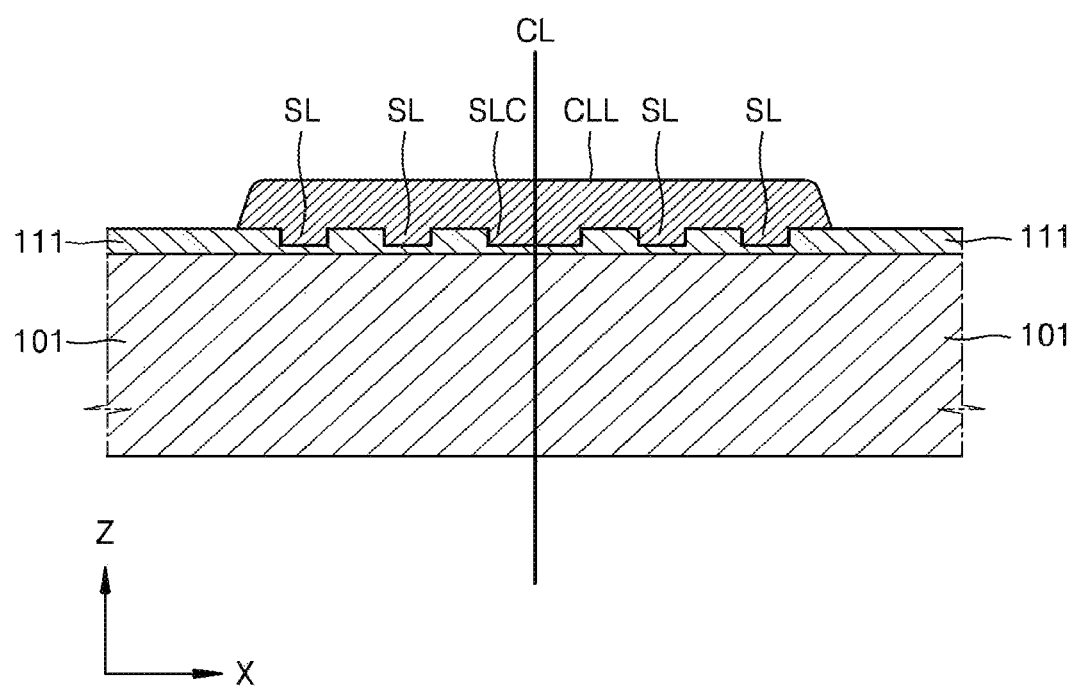
FIG. 37 illustrates a modified example of the structure shown in FIG. 36.

FIG. 37 illustrates a modified example of the structure shown in FIG. 36.

Referring to FIG. 37, the first insulating layer 111 is formed on the substrate 101 in the peripheral area PA. A plurality of slits SL is formed on the first insulating layer 111. The plurality of slits SL is formed in the peripheral area PA so as to be spaced apart from the display area DA.

Also, a slit SLC from among the plurality of slits SL may overlap with a cutting line CL. The slit SLC that overlaps with the cutting line CL may increase an effect of preventing occurrence of a crack on the first insulating layer 111 during a cutting process performed along the cutting line CL.

The cladding layer CLL is formed on the first insulating layer 111 so as to cover the plurality of slits SL. The cladding layer CLL may overlap with the cutting line CL. After the cutting process is performed, the cladding layer CLL may have a cross-section that is parallel to the cutting line CL.

As described above, according to the one or more of the above embodiments, the display apparatus may have improved durability and an improved image quality.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a display area displaying an image and comprising at least one display device on the substrate;
a peripheral area disposed outside the display area and adjacent to an edge of the substrate;
at least one insulating layer disposed on the substrate;
at least two slits obtained by removing a portion of the at least one insulating layer in a thickness direction of the at least one insulating layer and disposed on the peripheral area; and
a cladding layer disposed on the at least one insulating layer and covering the at least two slits,
wherein a portion of the cladding layer that is on the at least one insulating layer extends across the at least two slits in a direction perpendicular to the thickness direction.

2. The display apparatus of claim 1, further comprising a thin-film transistor in the display area and connected to the display device, the thin film transistor comprising an active area, a gate electrode, a source electrode, and a drain electrode.

3. The display apparatus of claim 2, wherein the at least one insulating layer comprises a first insulating layer between the substrate and the active area, and
wherein the at least two slits are obtained by removing the first insulating layer.

4. The display apparatus of claim 3, further comprising a barrier layer between the substrate and the first insulating layer,
wherein the at least one insulating layer further comprises the barrier layer, and
wherein at least two slits are obtained by removing the first insulating layer and the barrier layer.

5. The display apparatus of claim 3, further comprising a second insulating layer between the active layer and the gate electrode, and
wherein the at least two slits are obtained by removing the first insulating layer and the second insulating layer.

6. The display apparatus of claim 5, further comprising a third insulating layer between the gate electrode and the source and drain electrodes, and
wherein the at least two slits are obtained by removing the first to third insulating layers.

7. The display apparatus of claim 6, wherein a height from one surface of the substrate to a top surface of the third insulating layer, in which the at least two slits are arranged, is less than a height from the one surface of the substrate to top surfaces of the source and drain electrodes.

8. The display apparatus of claim 6, further comprising a passivation layer on the third insulating layer and covering the thin film transistor,
wherein a height from one surface of the substrate to a top surface of the third insulating layer, in which the at least two slits are arranged, is less than a height from the one surface of the substrate to a top surface of the passivation layer.

9. The display apparatus of claim 8, wherein the cladding layer comprises a same material as the passivation layer.

10. The display apparatus of claim 1, wherein the at least two slits are spaced apart from the edge of the substrate.

11. The display apparatus of claim 1, wherein the at least one insulating layer comprises an inorganic insulating material.

12. The display apparatus of claim 1, further comprising an encapsulating layer encapsulating the display device,
wherein the encapsulating layer is spaced apart from the cladding layer.

13. A display apparatus comprising:
a substrate;
a display area displaying an image and comprising at least one display device on the substrate;
a peripheral area disposed outside the display area and adjacent to an edge of the substrate;
a thin-film transistor in the display area and connected to the display device;
at least one insulating layer disposed between the substrate and the thin film transistor;
at least two slits obtained by removing a portion of the at least one insulating layer in a thickness direction of the substrate and disposed on the peripheral area; and
a cladding layer disposed on the at least insulating layer and covering the at least one slit, the cladding layer comprising an insulating material.

14. The display apparatus of claim 13, further comprising a passivation layer covering the thin film transistor,
wherein the cladding layer comprises a same material as the passivation layer.

15. The display apparatus of claim 13, wherein the cladding layer comprises an organic insulating material.

16. The display apparatus of claim 13, further comprising an encapsulating layer encapsulating the display device,
a first side of the cladding layer close to the display area is spaced apart from an edge of the encapsulating layer.

17. The display apparatus of claim 16, wherein a second side of the cladding layer far from the display area, the second side being opposite to the first side, is spaced apart from the edge of the substrate.

18. The display apparatus of claim 16, wherein the encapsulating layer comprises at least one inorganic encapsulating layer and at least one organic encapsulating layer.

19. The display apparatus of claim 13, wherein the at least two slits are spaced apart from the edge of the substrate.

20. The display apparatus of claim 13, wherein the at least one insulating layer comprises an inorganic insulating material.

* * * * *